United States Patent
Bu et al.

(10) Patent No.: US 10,790,386 B2
(45) Date of Patent: Sep. 29, 2020

(54) SILICON CARBIDE SEMICONDUCTOR DEVICE WITH HORIZONTAL AND VERTICAL CURRENT FLOW

(71) Applicant: HITACHI, LTD., Tokyo (JP)

(72) Inventors: Yuan Bu, Tokyo (JP); Hiroshi Miki, Tokyo (JP); Naoki Tega, Tokyo (JP); Naoki Watanabe, Tokyo (JP); Digh Hisamoto, Tokyo (JP); Takeru Suto, Tokyo (JP)

(73) Assignee: HITACHI, LTD., Tokyo (JP)

(*) Notice: Subject to any disclaimer, the term of this patent is extended or adjusted under 35 U.S.C. 154(b) by 48 days.

(21) Appl. No.: 16/216,333

(22) Filed: Dec. 11, 2018

(65) Prior Publication Data
US 2019/0229211 A1    Jul. 25, 2019

(51) Int. Cl.
*H01L 29/78*    (2006.01)
*H01L 21/02*    (2006.01)
*H01L 29/04*    (2006.01)
*H01L 29/08*    (2006.01)
*H01L 29/10*    (2006.01)
(Continued)

(52) U.S. Cl.
CPC ...... *H01L 29/7813* (2013.01); *H01L 21/0262* (2013.01); *H01L 21/02378* (2013.01); *H01L 21/02529* (2013.01); *H01L 21/02634* (2013.01); *H01L 21/046* (2013.01); *H01L 21/049* (2013.01); *H01L 21/0475* (2013.01); *H01L 21/0485* (2013.01); *H01L 21/0495* (2013.01); *H01L 29/045* (2013.01); *H01L 29/086* (2013.01); *H01L 29/0865* (2013.01); *H01L 29/0878* (2013.01); *H01L 29/0882* (2013.01);
(Continued)

(58) Field of Classification Search
CPC ............... H01L 29/7813; H01L 29/045; H01L 29/0865; H01L 29/1095; H01L 29/1608; H01L 29/7827

USPC ............. 257/77, E29.256, E29.257, E29.262
See application file for complete search history.

(56) References Cited

U.S. PATENT DOCUMENTS 7,446,374 B2 * 11/2008 Thorup .............. H01L 29/7813
                                                        257/330
9,653,599 B2    5/2017 Kobayashi et al.
(Continued)

FOREIGN PATENT DOCUMENTS

JP    2017-079251 A    4/2017

OTHER PUBLICATIONS

Yen, C., et al., "1700V/30A 4H-SiC MOSFET with Low Cut-in Voltage Embedded Diode and Room Temperature Boron Implanted Termination," Proceedings of the 27th International Symposium on Power Semiconductor Devices & ICs, May 10-14, 2015, Kowloon Shangri-La, Hong Kong, pp. 265-268.

*Primary Examiner* — Robert T Huber
(74) *Attorney, Agent, or Firm* — Volpe and Koenig, P.C.

(57) ABSTRACT

A silicon carbide semiconductor device includes an n-type silicon carbide semiconductor substrate, a drain electrode electrically connected to a rear face, an n-type semiconductor layer having a second impurity concentration lower than the first impurity concentration, a p-type first semiconductor region, an n-type second semiconductor region, and an n-type third semiconductor region. A trench is formed having a gate electrode therein in which the bottom face of the trench contacts the p-type semiconductor region. A metal layer is electrically connected to the third semiconductor region, and a source electrode electrically connects the second semiconductor region and the metal layer to each other.

14 Claims, 17 Drawing Sheets

3: BODY LAYER      6: CURRENT DIFFUSION LAYER    8: GATE INSULATING FILM
5: SOURCE REGION   7: METAL LAYER                 9: GATE ELECTRODE
                                                   11: TRENCH

(51) Int. Cl.
  *H01L 29/16* (2006.01)
  *H01L 21/04* (2006.01)
  *H01L 29/36* (2006.01)
  *H01L 29/417* (2006.01)
  *H01L 29/423* (2006.01)
  *H01L 29/47* (2006.01)
  *H01L 29/66* (2006.01)
  *H02M 7/5387* (2007.01)
  *H01L 29/872* (2006.01)
  *B60L 50/50* (2019.01)
  *H01L 29/06* (2006.01)
  *H02P 27/08* (2006.01)

(52) U.S. Cl.
  CPC ...... *H01L 29/1095* (2013.01); *H01L 29/1608* (2013.01); *H01L 29/36* (2013.01); *H01L 29/41741* (2013.01); *H01L 29/4236* (2013.01); *H01L 29/47* (2013.01); *H01L 29/66068* (2013.01); *H01L 29/7827* (2013.01); *B60L 50/50* (2019.02); *B60L 2210/00* (2013.01); *H01L 29/0619* (2013.01); *H01L 29/872* (2013.01); *H02M 7/5387* (2013.01); *H02M 7/53871* (2013.01); *H02P 27/08* (2013.01)

(56) References Cited

U.S. PATENT DOCUMENTS

| | | | |
|---|---|---|---|
| 9,887,287 B1* | 2/2018 | Lichtenwalner | H01L 29/4236 |
| 2005/0167742 A1* | 8/2005 | Challa | H01L 29/66734 |
| | | | 257/328 |
| 2006/0267090 A1* | 11/2006 | Sapp | H01L 29/0869 |
| | | | 257/341 |
| 2014/0252463 A1 | 9/2014 | Darwish et al. | |

* cited by examiner

3: BODY LAYER    6: CURRENT DIFFUSION LAYER   8: GATE INSULATING FILM
5: SOURCE REGION  7: METAL LAYER              9: GATE ELECTRODE
                                              11: TRENCH

SILICON CARBIDE SEMICONDUCTOR DEVICE WITH HORIZONTAL AND VERTICAL CURRENT FLOW

BACKGROUND OF THE INVENTION

1. Field of the Invention

The present invention relates to a silicon carbide semiconductor device used as a power semiconductor device and a fabrication method therefor, a power conversion apparatus, an automobile and a railway vehicle.

2. Description of the Related Art

Depletion of energy resources and emissions of greenhouse gases such as $Co_2$ are significant challenges in realizing a sustainable society. Therefore, from a point of view of improving the energy conversion efficiency of a power conversion apparatus, it is investigated to use, in a power MISFET (Metal Insulator Semiconductor Field Effect Transistor) used as a power semiconductor device, a silicon carbide (SiC) substrate (hereinafter referred to as SIC substrate) in place of a silicon (Si) substrate that has been used conventionally.

A power MISFET that uses a SiC substrate (hereinafter referred to as SiC power MISFET) is capable of reducing the loss in comparison with a Si power MISFET that uses a Si substrate. Further, the SiC power MISFET is capable of reducing the on-resistance with an equal withstanding voltage in comparison with the Si power MISFET. This arises from the fact that the breakdown field strength of SiC is as high as approximately seven times that of Si and the epitaxial layer serving as a drift layer can be formed thinner.

In the SiC power MISFET of a DMOS (Double Diffused Metal Oxide Semiconductor) structure, in order to prevent increase of the channel resistance, a MISFET of a trench structure that uses a crystal plane having a high carrier mobility as the channel region is available. However, the MISFET of such a trench structure as just described has a problem that dielectric breakdown is liable to occur in the gate insulating film. In contrast, JP-2017-079251-A discloses that the gate insulating film electric field in an off state is decreased by electrically coupling the surface of the trench or a region just below the trench to the source electrode. Meanwhile, U.S. Patent Publication No. 2014/0252463 discloses that the gate insulating film electric field in an off state is decreased by forming a p-type region at a lower portion of the trench.

Further, a phenomenon (energization deterioration phenomenon) is known that, in the case where a BPD (Basal Plane Dislocation) exists in a SiC drift layer, when forward current flows to a PN junction, the BPD is expanded by recombination of electrons and holes, resulting in increase of the stacking fault area. In order to solve this problem, a technology of producing a Schottky barrier diode structure for allowing current to flow bypassing the PN junction on a chip to prevent the deterioration is disclosed in Cheng-Tyng Yen et al., "1700V/30 A 4H—SiC MOSFET with Low Cut-in Voltage Embedded Diode and Room Temperature Boron Implanted Termination", Proceedings of the 27th International Symposium on Power Semiconductor Devices & ICs, p. 265, 2015.

SUMMARY OF THE INVENTION

In the case where the bottom of the trench in which the gate electrode is embedded extends to the n-type semiconductor layer serving as a drift layer as in the MISFET disclosed in the JP-2017-079251-A and U.S. Patent Publication No. 2014/0252463 specified above, the withstanding voltage of the gate insulating film decreases and the reliability of the silicon carbide semiconductor devices decreases. Further, if energization deterioration is caused by recombination of holes and electrons in the SiC substrate, then the performance of the silicon carbide semiconductor device degrades.

The above and other objects, features and advantages of the present invention will become apparent from the following description of the present specification and the accompanying drawings.

A representative one of embodiments disclosed herein can be simplified in the following manner.

A silicon carbide semiconductor device of the representative embodiment is a SiC power MISFET that includes an n-type source region and an n-type current diffusion layer, a trench having side faces contacting with a p-type body layer between the n-type source region and the n-type current diffusion layer, a gate electrode embedded in the trench with a gate insulating film interposed therebetween, and a metal layer that forms a Schottky junction on an upper face of the n-type current diffusion layer neighboring with the trench.

Briefly, the representative embodiment of the present invention disclosed herein can achieve the following advantageous effect.

According to the present embodiment, the reliability and a performance of the silicon carbide semiconductor device can be improved. Especially, the voltage withstanding property of the gate insulating film is improved and increase of the on-resistance caused by energization deterioration can be prevented.

DESCRIPTION OF THE PREFERRED EMBODIMENTS

Figure 1:
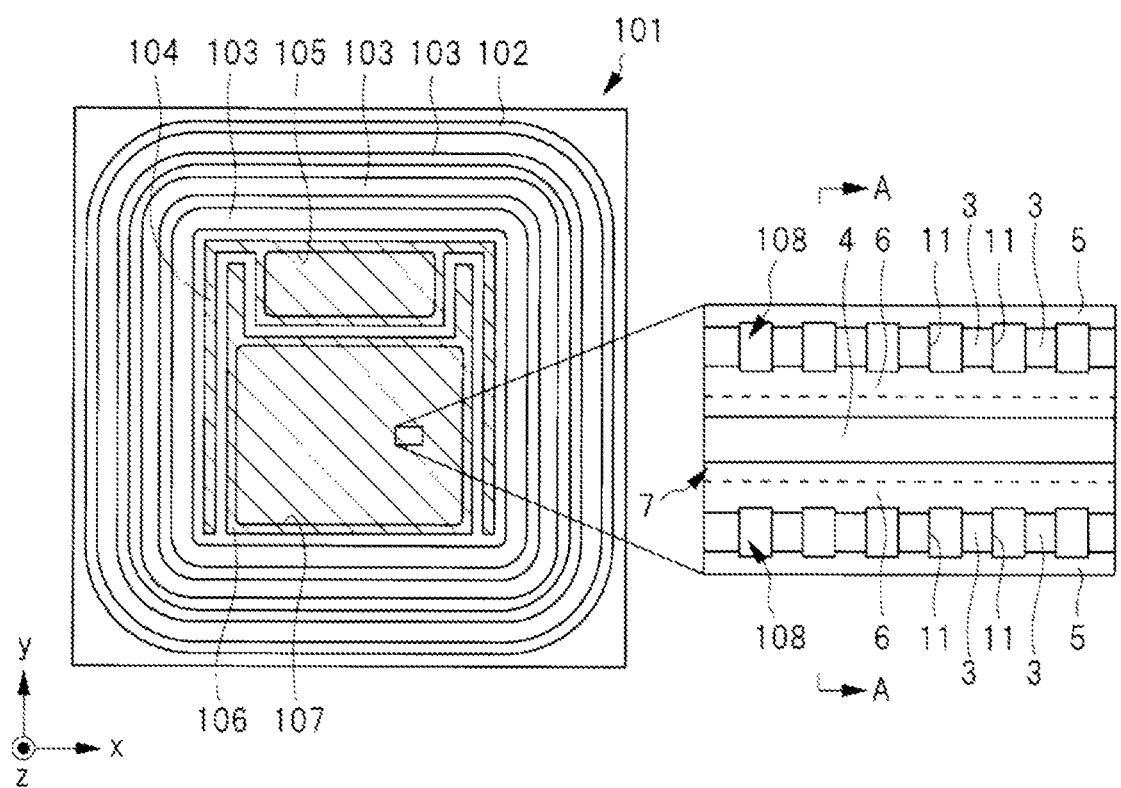
FIG. 1 is a top plan view depicting a silicon carbide semiconductor device according to an embodiment 1 of the present invention.

In the following, embodiments of the present invention are described with reference to the drawings. It is to be noted that, in all figures depicting the embodiments, like elements having like functions are denoted by like reference characters, and overlapping description of them is omitted herein. Further, in the following description of the embodiments, except where it is especially necessary, description of same or like portions is not repeated in principle. Further, in the figures referred to description of the embodiments, in order to facilitate understandings, even a plan view, a perspective view or the like sometimes has slanting lines. Furthermore, in the figures depicting the embodiments, slanting lines are sometimes omitted in a cross sectional view in order to facilitate understandings of a configuration.

Embodiment 1

In the following, a silicon carbide semiconductor device is described with the drawings, taking a MISFET (MIS type field effect transistor) having a side face of a trench (groove or recess) as a channel region as an example. However, the silicon carbide semiconductor device is not limited to this.

<Structure of Silicon Carbide Semiconductor Device>

Figure 2:
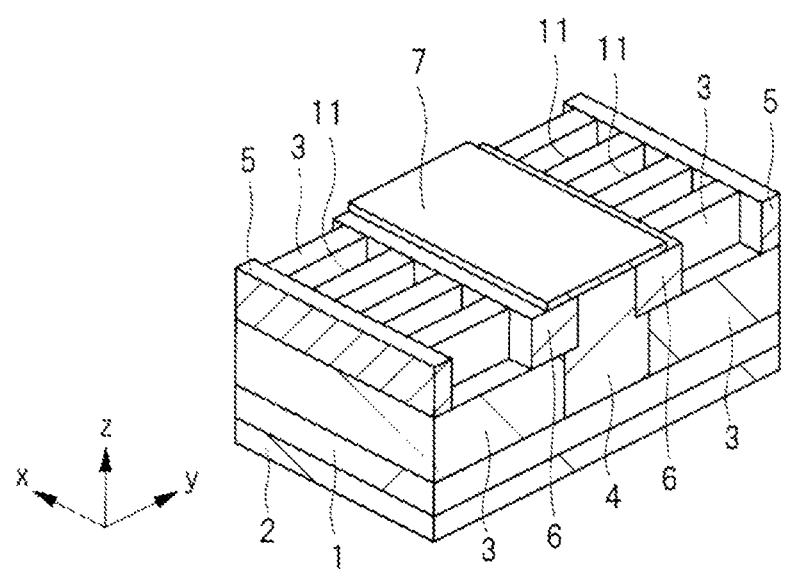
FIGS. 2 and 3 are perspective views of the silicon carbide semiconductor device according to the embodiment 1 of the present invention.
Figure 3:
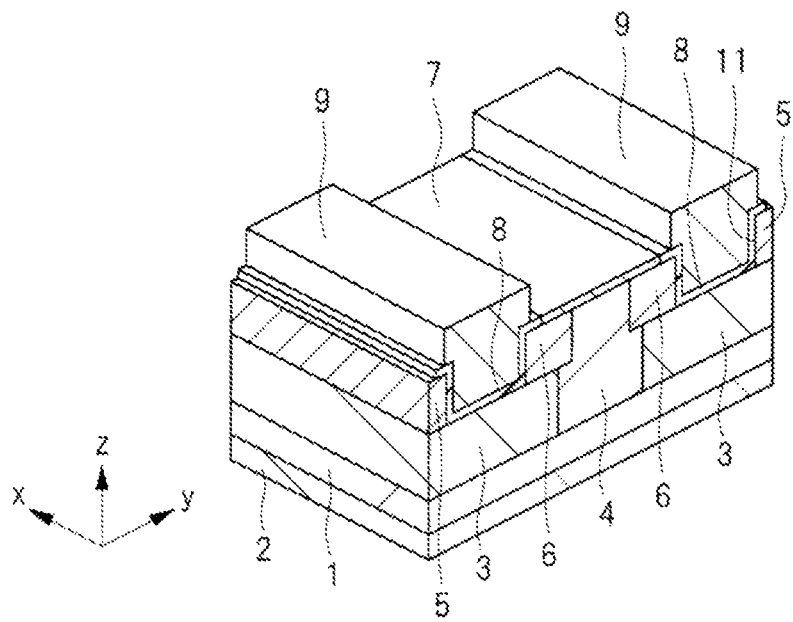
Figure 4:
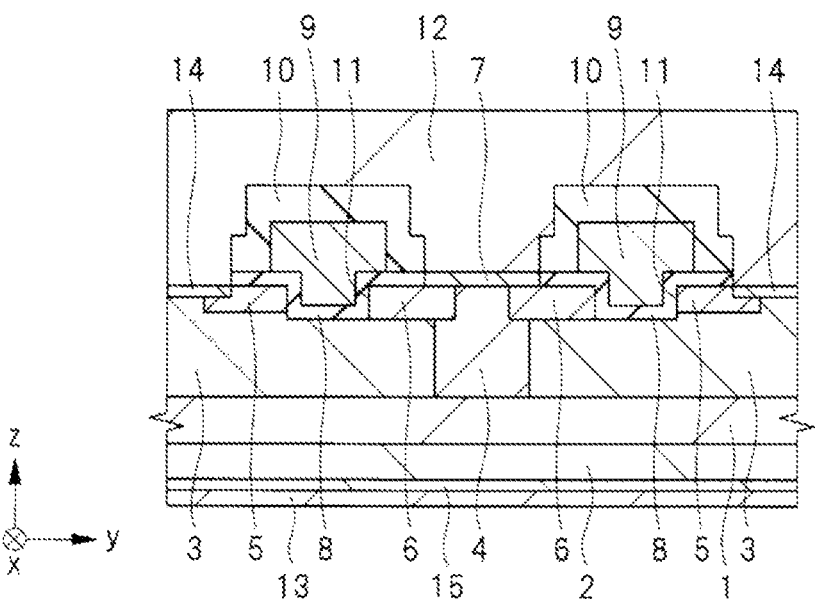
FIG. 4 is a cross sectional view taken along line A-A of FIG. 1.

In the following, a structure of the silicon carbide semiconductor device according to the present embodiment 1 is described with reference to FIGS. 1 to 4. FIG. 1 is a top plan view depicting a SiC power MISFET that is a silicon carbide semiconductor device of the present embodiment. FIGS. 2 and 3 are perspective views depicting the SiC power MISFET, and FIG. 4 is a cross sectional view depicting the silicon carbide semiconductor device.

In FIG. 1, a top plan view of an overall semiconductor chip on which the SiC power MISFET is mounted and an enlarged plan view that depicts part of an active region of the semiconductor chip in an enlarged scale are depicted side by side. In FIG. 2, different from FIG. 3, a gate insulating film and a gate electrode are not depicted. Further, in FIGS. 2 and 3, a silicide layer, a source electrode, an interlayer insulating film, an electrode for drain wiring and so forth are not depicted. FIG. is a sectional view taken along a y-z plane of FIG. 3 and indicating a cross section including a trench. In short, FIG. 4 is a cross sectional view taken along line A-A of FIG. 1. In order to facilitate understandings of a configuration of the silicon carbide semiconductor device, in FIG. 1, regions in which a gate wiring electrode 104 and a source wiring electrode 106 are formed are indicated by slanting lines.

As depicted in FIG. 1, a semiconductor chip 101 on which the silicon carbide semiconductor device is mounted is configured from an active region (SiC power MISFET region, element region) positioned below a source wiring electrode 106 to which a plurality of n-channel SiC power MISFETs are connected in parallel and a peripheral region surrounding the active region as viewed in top plan. In the peripheral region, a plurality of field limiting rings (FLRs) 103 configured from a p-type semiconductor layer that is in an electrically floating state and formed so as to surround the active region as viewed in top plan are formed. Further, in the peripheral region, a guard ring 102 configured from an n-type semiconductor region is formed so as to surround the plurality of field limiting rings 103 as viewed in top plan.

The semiconductor chip 101 has an n-type SiC substrate, and an n-type silicon carbide (SiC) epitaxial substrate (hereinafter referred to as SiC epitaxial substrate) configured from an epitaxial layer formed from n-type silicon carbide (SiC) formed on the SiC substrate, and has a rectangular structure as viewed in top plan. On the main face (upper face, surface) side of the active region of the SiC epitaxial substrate, a gate electrode, an n-type source region, a channel region and so forth of the SIC power MISFET are formed, and on the rear face side on the opposite side to the main face of the SiC epitaxial substrate, an n-type drain region of the SiC power MISFET is formed.

Each of the field limiting rings 103 is formed on an upper face of the SiC epitaxial substrate and has an annular structure as viewed in top plan. In short, in top plan, the first field limiting ring 103 is formed so as to surround the active region; the second field limiting ring 103 is formed so as to surround the first field limiting ring 103; and the third field limiting ring 103 is formed so as to surround the second field limiting ring 103.

Where the plurality of field limiting rings 103 are formed around the active region, when the SiC power MISFET is off, a maximum electric field portion successively is displaced to an outer side field limiting ring 103 and surrenders at the outermost field limiting ring 103, and consequently, the withstanding voltage of the silicon carbide semiconductor device can be increased. Although three field limiting rings 103 are depicted in FIG. 1, the number of field limiting rings 103 is not limited to this. Further, the guard ring 102 is configured from an n-type semiconductor region formed, for example, on an upper face of the SiC epitaxial substrate and has a function for protecting the SiC power MISFET formed in the active region.

On the SiC epitaxial substrate in the active region, a gate wiring electrode 104 and a source wiring electrode 106 are disposed in a spaced relationship from each other. As depicted in the enlarged top plan view on the right side in FIG. 1, a plurality of SiC power MISFETs 108 formed in the active region have stripe patterns as viewed in top plan, and the gate electrodes of all SiC power MISFETs are electrically connected to the gate wiring electrode 104 by lead wires (gate bus lines) individually connecting to the stripe patterns.

Further, the plurality of SiC power MISFET are covered with the source wiring electrode 106, and the source electrodes of the SiC power MISFETs and a potential fixing layer of the body layer are connected to the source wiring electrode 106. The source wiring electrode 106 is connected to an external wire through a source opening 107 that extends through the insulating film. The gate wiring electrode 104 is connected to the gate electrode of the SiC power MISFETs. The gate wiring electrode 104 is connected to an external wire through a gate opening 105 that extends through the insulating film. Further, the n-type drain region formed on the rear face side of the SiC epitaxial substrate is electrically connected to a drain wiring electrode 13 (refer to FIG. 4) formed over an overall area of the rear face of the n-type SiC epitaxial substrate.

As depicted in the enlarged plan view on the right side in FIG. 1, a source region 5, a body layer 3, a current diffusion layer 6, a JFET region 4, a current diffusion layer 6, a body layer 3 and a source region 5 are disposed side by side in order in a y direction (transverse direction, horizontal direction) that is a direction along the upper face of the SiC epitaxial substrate. Each of the JFET region 4, current diffusion layers 6, body layers 3 and source regions 5 extend in a direction orthogonal to the y direction as viewed in top plan, namely, in an x direction (transverse direction, horizontal direction) along the upper face of the SiC epitaxial substrate. It is to be noted that, on the upper face of the body layer 3, a plurality of trenches (grooves, recesses) 11 are formed side by side in an equally spaced relationship in the x direction. Each trench 11 contacts at one end portion (side face) thereof in the y direction with a current diffusion layer 6 and contacts at the other end portion (side face) thereof with a source region 5. Each trench 11 has a rectangular structure as viewed in top plan.

Further, in the enlarged top plan view on the right side in FIG. 1, the profile of a metal layer 7 that covers the upper face of the JFET region 4 and part of an upper face of the two current diffusion layers 6 sandwiching the upper face of the JFET region 4 in the y direction is indicated by broken lines. The metal layer 7 extends in the x direction. Though not depicted, a gate electrode is formed on the trenches 11, current diffusion layers 6, body layers 3 and source regions 5 exposed from the metal layer 7 with a gate insulating film interposed therebetween and extends in the x direction.

As depicted in FIGS. 2 to 4, the SiC power MISFET according to the present embodiment has an n-type SiC substrate (semiconductor substrate, bulk substrate) 2, and an epitaxial layer 1, which is an n-type semiconductor layer having a concentration of an n-type impurity lower than that of the SiC substrate 2, is formed on the SiC substrate 2. The epitaxial layer 1 functions as a drift layer. The epitaxial layer 1 has a film thickness of, for example, approximately 5 to 100 µm. The crystal plane of the upper face of the SiC substrate 2 and the epitaxial layer 1 is the Si plane, namely, the (0001) plane. The SiC epitaxial substrate is configured from a stacked substrate (semiconductor substrate) configured from the SiC substrate 2 and the epitaxial layer 1.

The p-type body layer (well region, p-type semiconductor region) 3 is formed in the epitaxial layer 1 to a predetermined depth in the epitaxial layer 1 from the surface (upper face) of the epitaxial layer 1. In other words, the lower face of the body layer 3 does not extend to the lower face of the epitaxial layer 1. In the body layer 3, the source region 5 that is an n-type semiconductor region is formed to a predetermined depth in the body layer 3 from the surface (upper face) of the body layer 3 (epitaxial layer 1).

In the epitaxial layer 1 sandwiched between the two body layers 3 lined up in the y direction, the current diffusion layers 6 that are two n-type semiconductor regions lined up in the y direction are formed in a spaced relationship from each other to a predetermined depth in the epitaxial layer 1 from the surface (upper face) of the epitaxial layer 1. Between the two body layers 3 lined upon in the y direction, the JFET region 4 (Junction Field Effect Transistor) that is an n-type semiconductor region is formed to a predetermined depth in the epitaxial layer 1 from the surface (upper face) of the epitaxial layer 1. The JFET region 4 is positioned between the two current diffusion layers 6 lined up in the y direction. The JFET region 4 is formed deeper than the current diffusion layers 6 and the source regions 5 and has a depth equal to that of the body layer 3. In the y direction, the current diffusion layers 6 contacting with the JFET region 4 and the body layer 3 are formed.

The current diffusion layers 6 are electrically connected to the JFET region 4, and the JFET region 4 is electrically connected to the epitaxial layer 1, which is in turn electrically connected to the SiC substrate 2. Further, each of the source regions 5 is covered at a side face and a bottom face thereof with the body layer 3, and the source regions 5 are separated and electrically isolated from the epitaxial layer 1 that is an n-type semiconductor region, the JFET region 4 and the current diffusion layers 6.

Each trench (groove, recess) 11 is formed on the upper face of the epitaxial layer 1 and extends from a source region 5 to a body layer 3 so as to hang on a current diffusion layer 6. The trench 11 has a first side face and a second side face opposing to each other in the y direction, and a third side face and a fourth side face crossing with the first side face and the second side face. The trench 11 is formed in contact with the source region 5, body layer 3 and current diffusion layer 6 as viewed in top plan. In other words, the first side face that is one end portion of the trench 11 in the y direction contacts with the source region 5, and the second side face that is the other end portion in the y direction contacts with the current diffusion layer 6. The other side faces of the trench 11, namely, the third side face and the fourth side faces extending along the y-z plane, contact with the body layer 3.

The trench 11 is a recess that extends from the source region 5 to the current diffusion layer 6 in the y direction, and part of the side faces (third side face and fourth side face) are configured from the body layer 3 between the source region 5 and the current diffusion layer 6. Here, the crystal plane of the third side face and the four side face of the trench 11 is the (11-20) plane or the (1-100) plane.

In FIG. 2, a structure is depicted in which the source region 5 and the current diffusion layer 6 are not formed on the third side face and the fourth side face of the trench 11 but only the body layer 3 is formed. Actually, however, the body layer 3 and the current diffusion layer 6 are formed continuously in the y direction on the third side face and the fourth side face.

It is to be noted that the z direction is a direction orthogonal to the x direction and the y direction and is a direction perpendicular to the upper face of the SiC epitaxial substrate. The bottom face of the trench 11 contacts with the body layer 3. In other words, the trench 11 is shallower than the body layer 3, and the bottom face of the trench 11 does not extend to the lower face of the body layer 3.

On the surface of the trench 11, a gate insulating film 8 (not depicted in FIG. 2) is formed. In other words, the gate insulating film 8 covers the bottom face of the trench 11 and all side faces of the trench 11. Further, the gate insulating film 8 continuously covers, in addition to the surface of the trench 11, the upper face of the body layer 3 in the region adjacent the trench 11, part of the upper face of the source region 5 and part of the upper face of the current diffusion layer 6. The gate insulating film 8 is configured, for example, from a $SiO_2$ (silicon oxide) film.

On the gate insulating film 8, a gate electrode 9 (not depicted in FIG. 2) is formed except a region just above the epitaxial layer 1 sandwiched between the current diffusion layers 6. In other words, the gate electrode 9 is filled in the trench 11 with the gate insulating film 8 interposed therebetween. The gate electrode 9 is formed above an upper end of the trench 11 and covers, in a region neighboring with the trench 11, an upper face of the body layer 3, part of an upper face of the source region 5 and part of an upper face of the current diffusion layer 6. The gate electrode 9 extending in the x direction fully fills the inner sides of the plurality of trenches 11 lined up in the x direction. In other words, the gate electrode 9 is formed so as to span the plate-shaped body layer 3 between the trenches 11, which neighbor with each other in the x direction, in the x direction. The gate electrode 9 is configured, for example, from a polycrystalline silicon film.

On the epitaxial layer 1 (JFET region 4) sandwiched between the two current diffusion layers 6 in the y direction, the metal layer (metal potential fixing layer) 7 for fixing the potential of the current diffusion layers 6 is formed in contact with the upper face of the epitaxial layer 1. The metal layer 7 continuously covers the upper face of the JFET region 4 and part of the upper face of the two current diffusion layers 6 sandwiching the JFET region 4 and is electrically connected to the JFET region 4 and the current diffusion layers 6. As a result, the current diffusion layers 6 neighboring with the trenches 11 have a structure that they have the metal layer 7 at an upper portion thereof and have the body layer 3 at a lower portion thereof, namely, a stacked layer of metal/n-type SiC/p-type SiC in the z direction (vertical direction). In other words, the metal layer 7, current diffusion layers 6 and body layers 3 overlap with each other as viewed in top plan. However, the upper face of the current diffusion layers 6 neighboring with the trenches 11 is exposed from the metal layer 7. The metal layer 7 is spaced from the gate electrode 9 and the gate electrode 9 is not formed just above the metal layer 7. The metal layer 7 neighbors with the gate insulating film 8 just above the current diffusion layers 6.

As depicted in FIG. 4, the gate electrode 9 and the upper face of the gate insulating film 8 exposed from the gate electrode 9 are covered with an interlayer insulating film 10.

The interlayer insulating film 10 is formed, for example, from a $SiO_2$ Film. On the interlayer insulating film 10, a source electrode 12 is formed. The source electrode 12 is electrically connected to the source region 5 and the metal layer 7 that are exposed from the interlayer insulating film 10. The gate electrode 9, source electrode 12, source region 5 and metal layer 7 are isolated from each other by the interlayer insulating film 10. A metal silicide 14 is interposed between the source region and the source electrode 12. The source electrode 12 is electrically connected to the body layer 3 in a region not depicted (for example, a region neighboring with the source region 5). Therefore, the potential of the body layer 3 can be fixed to the source potential. In this manner, the source electrode 12 is connected to the body layer 3 and the source region 5, and the SiC power MISFET of the present embodiment has a DMOS (Double Diffused Metal Oxide Semiconductor) structure.

On the rear face on the opposite side to the upper face of the SiC substrate 2, a drain wiring electrode (drain electrode, rear face electrode) 13 is formed with a metal silicide layer 15 interposed therebetween. In short, the drain wiring electrode 13 is electrically connected to the rear face of the SiC substrate 2. The source electrode 12 is confirmed, for example, from Al (aluminum). The metal silicide layers 14 and 15 are configured, for example, from NiSi (nickel silicide). The drain wiring electrode 13 is configured from a stacked film formed from a Ti (titanium) film, a Ni (nickel film) and an Au (gold) film, for example, formed in order downwardly from the rear face side of the SiC substrate 2. Here, the junction between the current diffusion layer 6 and JFET region 4 and the metal layer 7 is the Schottky junction. Therefore, between the source electrode 12 and the drain wiring electrode 13, a Schottky barrier diode is formed which is configured from the Schottky junction between the current diffusion layer 6 and JFET region 4 and the metal layer 7. In short, the SiC power MISFET of the present embodiment includes a diode (built-in diode). The built-in diode can be used as a reflux diode as hereinafter described in the description of embodiments 3 to 5 hereinafter described.

In order to form such a Schottky barrier diode as described above, as the material for the metal layer 7, a material is not used which is connected by ohmic connection to the current diffusion layer 6 and the JFET region 4. In the case where a conductive film that is connected by ohmic connection to the current diffusion layer 6 and the JFET region 4 is formed on the current diffusion layer 6 and the JFET region 4, the conductive film and the current diffusion layer 6, JFET region 4, epitaxial layer 1 and SiC substrate 2 are short-circuited to each other, by which a device is obtained in which a SiC power MISFET that is formed later does not operate and besides the SiC power MISFET does not have a built-in diode. Accordingly, the material of the metal layer 7 is restricted to a material that forms a Schottky junction to the epitaxial layer 1.

The depth (first depth) of the body layer 3 from the surface (upper face) of the epitaxial layer 1 is, for example, approximately 0.5 to 2 μm. The surface of the epitaxial layer 1 here indicates not the bottom face of the trench 11 but the upper face (uppermost face) of the epitaxial layer 1 in a region neighboring with the trench 11 in a horizontal direction. Further, the depth (second depth) of the source region 5 from the surface (upper face) of the epitaxial layer 1 is, for example, approximately 0.1 to 1 μm. The depth (third depth) of the current diffusion layer 6 from the surface (upper face) of the epitaxial layer 1 is, for example, approximately 0.1 to 1 μm. The depth (fourth depth) of the trench 11 of the surface (upper face) of the epitaxial layer 1 is smaller than the first depth of the body layer 3 from the surface (upper face) of the epitaxial layer 1 and is, for example, approximately 0.1 to 1.5 μm.

The preferable range of the impurity concentration of the SiC substrate 2 is, for example, $1 \times 10^{18}$ to $1 \times 10^{21}$ cm$^{-3}$. The preferable range of the impurity concentration of the n-type epitaxial layer 1 is, for example, $1 \times 10^{14}$ to $1 \times 10^{17}$ cm$^{-3}$. The preferable range of the impurity concentration of the p-type body layer 3 is, for example, $1 \times 10^{16}$ to $1 \times 10^{19}$ cm$^{-3}$. The preferable range of the maximum impurity concentration of the p-type body layer 3 is, for example, $1 \times 10^{17}$ to $1 \times 10^{19}$ cm$^{-3}$. The preferable range of the impurity concentration of the n-type source region 5 is, for example, $1 \times 10^{19}$ to $1 \times 10^{21}$ cm$^{-3}$. The preferable range of the impurity concentration of the n-type current diffusion layer 6 is, for example, $1 \times 10^{16}$ to $5 \times 10^{18}$ cm$^{-3}$. The SiC substrate 2, source region 5 and current diffusion layer 6 are higher in impurity concentration than the epitaxial layer 1. Further, the JFET region 4 is higher in impurity concentration than the epitaxial layer 1 and is lower in impurity concentration than the source region 5 and the current diffusion layer 6. Further, the metal layer 7 is formed, for example, from a Ti (titanium) film or a Ni (nickel) film.

The n-type source region 5, p-type body layer 3, n-type current diffusion layer 6, JFET region 4, epitaxial layer 1 and SiC substrate 2, and gate electrode 9 configure a SiC power MISFET 108 (refer to FIG. 1). The channel region of the SiC power MISFET is the surface of the trench 11 and the surface (upper face) of the body layer 3 sandwiched between the trenches 11 lined up in the x direction. In short, the channel of the SiC power MISFET is formed on each of the bottom face of the trench 11, the third side face and the fourth side face extending along the y-z plane from among the side faces of the trench 11, and the upper face of the body layer 3 neighboring in the x direction with the trench 11.

The current when the SiC power MISFET operates flows in the y direction in the channel. In short, when the SiC power MISFET is in an on state, electrons flow from the source region 5 along the surface of the body layer 3 (side faces and bottom face of the trench 11 and upper face of the body layer 3 neighboring with the trench 11) until they reach the current diffusion layer and then flow to the drain wiring electrode 13 through the current diffusion layer 6, JFET region 4, epitaxial layer 1 and SiC substrate 2. The channel length direction of the SiC power MISFET is the y direction, and the channel widthwise direction of the SiC power MISFET is the x direction. The channel width of the SiC power MISFET is a length along the surface of the body layer 3 including the surface of the trench 11.

The current diffusion layer 6 has a role of preventing current from flowing to part of regions in a concentrated manner arising from the fact that electrons passing the inside of the body layer 3 flow downwardly in the JFET region 4 and are directed along the short distance toward the SiC substrate 2 side. In particular, since the current diffusion layer 6 having a comparatively high impurity concentration is formed, electrons passing the inside of the body layer 3 are spread in the current diffusion layer 6 and flow uniformly through the n-type semiconductor region including the inside of the current diffusion layer 6 and the inside of the JFET region 4.

The gate insulating film 8 is formed on the channel region, and the gate electrode 9 is formed on the gate insulating film 8. However, the gate electrode 9 is not formed just above the JFET region 4 formed on the upper face of the epitaxial layer 1, and an end portion of the gate electrode 9 on the JFET region 4 side in the y direction is positioned just above the current diffusion layer 6. The length of the trench 11 in the y direction parallel to the channel length is, for example, approximately 1 to 3 μm. The length of the trench 11 in the x direction parallel to the channel width is, for example, approximately 0.1 to 2 μm. The distance between adjacent ones of the trenches 11 in the x direction parallel to the channel width is, for example, approximately 1 to 2 μm.

<Advantageous Effect of Silicon Carbide Semiconductor Device of Present Embodiment>

In the following, characteristics and advantageous effects of the SiC power MISFET according to the present embodiment 1 are described.

One of countermeasures effective to reduction of the on resistance of the SiC power MISFET of the DMOS structure is to reduce the channel resistance. In a DMOS structure of a comparatively low withstanding voltage (for example, of 600 V), the channel resistance is a main component of the on resistance. On the other hand, in a DMOS structure of a comparatively high withstanding voltage (for example, of 3300 V), although the ratio of the drift resistance in the on resistance increases, the ratio of the channel resistance is still high. Accordingly, reduction of the channel resistance is effective to reduction of the on resistance of the SiC power MISFET irrespective of the withstanding voltage.

A physical factor in that the channel resistance of a DMOS structure having no trench structure becomes high is that the carrier mobility in the Si plane ((0001) plane) that becomes a channel plane is low. In short, the carrier mobility in the channel of the SiC power MISFET relies upon the plane orientation of the semiconductor substrate including an epitaxial layer, and the carrier mobility is higher in the (11-20) plane and the (1-100) plane than in the (0001) plane or the (000-1) plane.

As depicted in FIGS. 2 to 4, in the SiC power MISFET of the present embodiment, not only the (0001) plane that is the upper face of the epitaxial layer 1 and the bottom face of the trench 11 but also the third side face and the fourth side face of the epitaxial layer 1 opposing to each other form a channel region. Accordingly, in the SiC power MISFET of the present embodiment that has the third side face and the fourth side face of the trench 11 whose crystal plane is the (11-20) plane or the (1-100) plane as a channel region has a channel mobility higher than that of a MISFET that has the (0001) plane or the (000-1) plane as a channel region. Further, by forming the trench 11, the channel width increases in comparison with that of a DMOS structure of the planar type that does not have a trench, and a high current concentration can be implemented. Therefore, the performance of the silicon carbide semiconductor device can be improved.

Further, in the case where, in a SiC power MISFET having a trench in which the gate electrode is embedded, the trench extends to the n-type epitaxial layer (drift layer) below the p-type body layer, since the gate insulating film and part of the gate electrode project to the drift layer side below the lower face of the p-type body layer that bears the withstanding voltage, there is the possibility that an electric field exceeding the withstand voltage may be applied to the gate insulating film, resulting in electric breakdown.

In contrast, the trench 11 in the present embodiment is formed only in the p-type body layer 3 and the bottom of the trench 11 does not project downwardly from the lower face of the body layer 3. Therefore, in comparison with a trench type MISFET in which the bottom of the trench extends to the SiC substrate side farther than the lower face of the body layer, in the present embodiment, an electric field to be applied to the gate insulating film formed in contact with the surface of the trench upon holding of the withstanding voltage can be moderated significantly. Since this can increase the withstanding voltage of the gate insulating film, the reliability of the silicon carbide semiconductor device can be improved.

Here, in the present embodiment, the metal layer 7 is formed on the current diffusion layer 6. Since the metal layer 7 is electrically connected to the source electrode 12 (not depicted in FIGS. 2 and 3), it has a source potential. In other words, the metal layer 7 and the source region 5 have an equal potential. Further, the metal layer 7 is electrically connected to the current diffusion layer 6. Consequently, the potential of the current diffusion layer 6, especially, the potential of an upper portion of the current diffusion layer 6, namely, of a portion at which the current diffusion layer 6 contacts with the metal layer 7, has a source potential. In this manner, the metal layer 7 has a role of fixing the potential of the current diffusion layer 6 to the source potential.

Therefore, the potential in the current diffusion layer 6 when the SiC power MISFET is off depends upon the potential of the metal layer 7 and the body layer 3 rather than the potential of the JFET region 4. Since the metal layer 7 and the body layer are electrically connected to the source electrode 12, the intensity of the electric field in the gate insulating film contacting with the current diffusion layer 6 on the surface of the trench 11 is suppressed to a strength of a level similar to that of the electric field caused by a potential difference between the gate and the source. Accordingly, since the gate insulating film in the proximity of the current diffusion layer 6 can be prevented from being destroyed by a concentrated electric field, the reliability of the gate insulating film is improved. In other words, the reliability of the silicon carbide semiconductor device can be improved.

Further, in the SiC power MISFET, in the case where a BPD (Basal Plane Dislocation) is formed in the epitaxial layer on the Si substrate, if electrons and holes are recombined in a region in which the BPD is formed, then dislocation is caused in the crystal in the epitaxial layer by energy emitted by the recombination. As a result, a surface defect called Shockley type stacking fault spreads in the epitaxial layer. Since such a stacking fault inhibits movement of electrons flowing in the vertical direction in the epitaxial layer (drift layer), in the SiC power MISFET in which the stacking fault spreads, the element resistance (substrate resistance) and the forward voltage (on voltage) increase. Since this stacking fault continues to increase because, when the SiC power MISFET is operated, electrons and holes flow into the SiC epitaxial substrate, the resistance between the source and the drain and the resistance of the built-in diode increase as energization time passes. In short, a problem occurs that a characteristic of the SiC power MISFET is changed by energization deterioration, resulting in decrease of the performance and the reliability of the silicon carbide semiconductor device.

In contrast, in the present embodiment, a layer including holes such as a p-type semiconductor region or the like is not formed between the current diffusion layer 6 and JFET region 4 and the metal layer 7. Since carriers existing in the metal layer 7 are only free electrons and no hole exists in the metal layer 7, no hole flows into the n-type current diffusion layer 6. Therefore, recombination of carriers arising from movement of holes from the metal layer 7 side into the current diffusion layer 6 does not occur. Accordingly, even if a BPD exists in the epitaxial layer 1 (drift layer), energization deterioration can be prevented.

Figure 20:
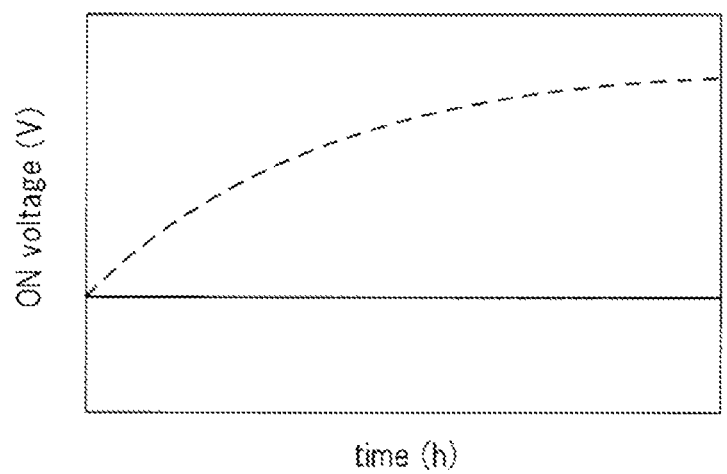
FIG. 20 is a graph depicting a characteristic variation of the on voltage of the silicon carbide semiconductor device.

FIG. 20 illustrates a relationship between the energization time and the on voltage of the SiC power MISFET in a graph. In particular, FIG. 20 is a graph illustrating a characteristic variation of the on voltage of the silicon carbide semiconductor device. In FIG. 20, a graph in the case where the metal layer 7 (refer to FIG. 2) is not formed and a stacking fault expands is indicated by a broken line, and a graph in the case of the SiC power MISFET of the present embodiment is indicated by a solid line. As indicated by the graph of the broken line, in the SiC power MISFET that does not include the metal layer 7 and in which a stacking fault expands by recombination of electrons and holes, as the energization time passes, the on voltage increases. In contrast, in the relationship in the present embodiment indicated by the solid line graph, even if the energization time passes, expansion of a stacking fault can be prevented, and therefore, increase of the on voltage can be prevented.

From the foregoing, a SiC power MISFET can be implemented which is low in resistance and low in loss in comparison with a SiC power MISFET of a DMOS structure in which the metal layer 7 is not formed. In other words, a performance of the silicon carbide semiconductor device can be improved. In addition, since energization deterioration arising from occurrence of a stacking fault can be prevented, the reliability of the silicon carbide semiconductor device can be improved.

<Fabrication Method of Silicon Carbide Semiconductor Device>

Figure 5:
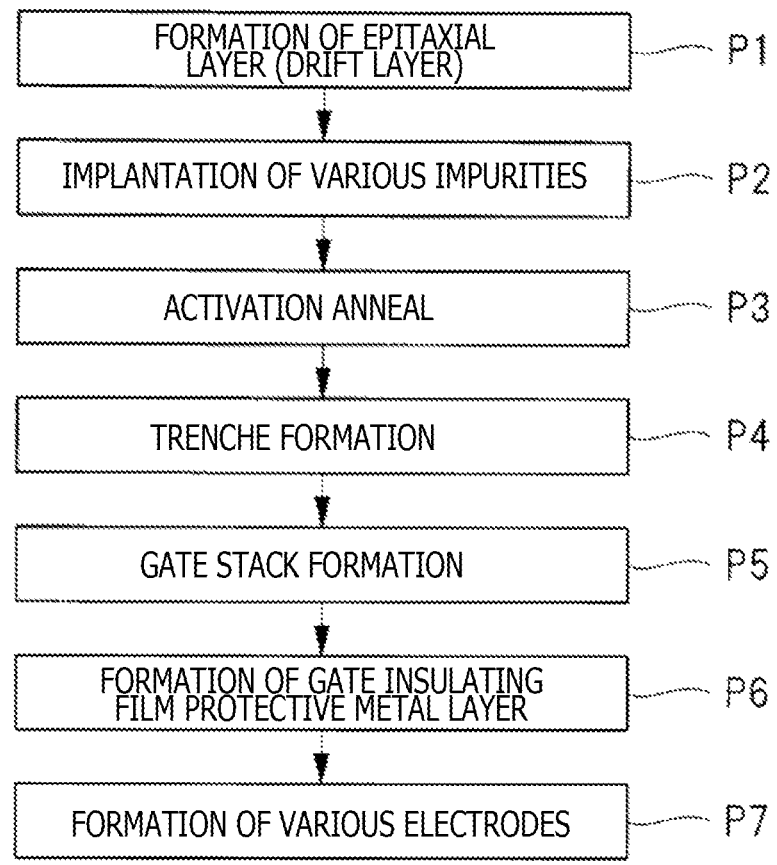
FIG. 5 is a flow chart illustrating a fabrication method of the silicon carbide semiconductor device according to the embodiment 1 of the present invention.

In the following, a fabrication method of a silicon carbide semiconductor device is described in order of steps with reference to FIGS. 5 to 19. FIG. 5 is a flow chart depicting a fabrication method of the silicon carbide semiconductor device according to the present embodiment. FIGS. 6 to 19 are sectional views depicting different stages of the fabrication method of the silicon carbide semiconductor device of the present embodiment. Here, the fabrication method of the silicon carbide semiconductor device is described in order in accordance with steps P1 to P7 depicted in FIG. 5.

<Step P1>

Figure 6:
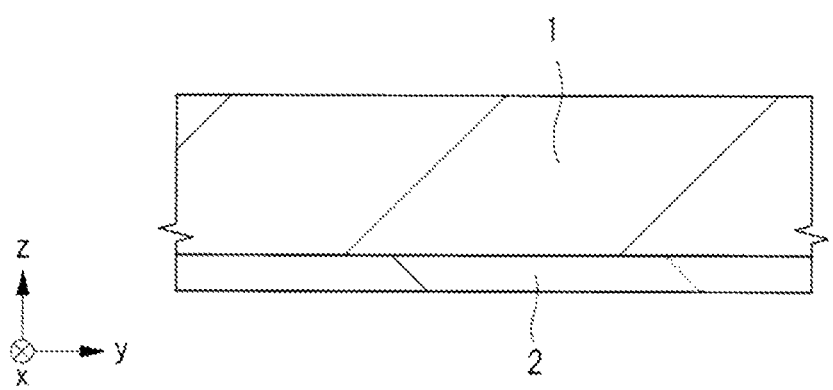
FIG. 6 is a cross sectional view illustrating the silicon carbide semiconductor device in manufacturing processes according to the embodiment 1 of the present invention.

First, an n-type 4H—SiC substrate 2 is prepared as depicted in FIG. 6. The 4H—SiC substrate 2 has an n-type impurity introduced therein. This n-type impurity is, for example, N (nitrogen), and the impurity concentration of this n-type impurity is, for example, $1 \times 10^{18}$ to $1 \times 10^{21}$ cm$^{-3}$. Further, although the SiC substrate 2 has two surfaces of a Si surface ((0001) plane) and a C surface ((000-1) plane), the surface (main surface, upper surface) of the SiC substrate 2 may be any of the Si surface and the C surface.

Then, an n-type epitaxial layer 1 formed from SiC (silicon carbide) is formed by an epitaxial growth method on the surface (first main face) of the SiC substrate 2. The epitaxial layer 1 has introduced therein an n-type impurity of an impurity concentration lower than the impurity concentration of the SiC substrate 2. Although the impurity concentration of the epitaxial layer 1 relies upon the device rating of the SiC power MISFET, it is, for example, $1 \times 10^{14}$ to $1 \times 10^{17}$ cm$^{-3}$. Further, the thickness of the epitaxial layer 1 is, for example, 5 to 100 μm. By the step described above, a SiC epitaxial substrate configured from the SiC substrate 2 and the epitaxial layer 1 of the n type is formed.

<Step P2>

Figure 7:
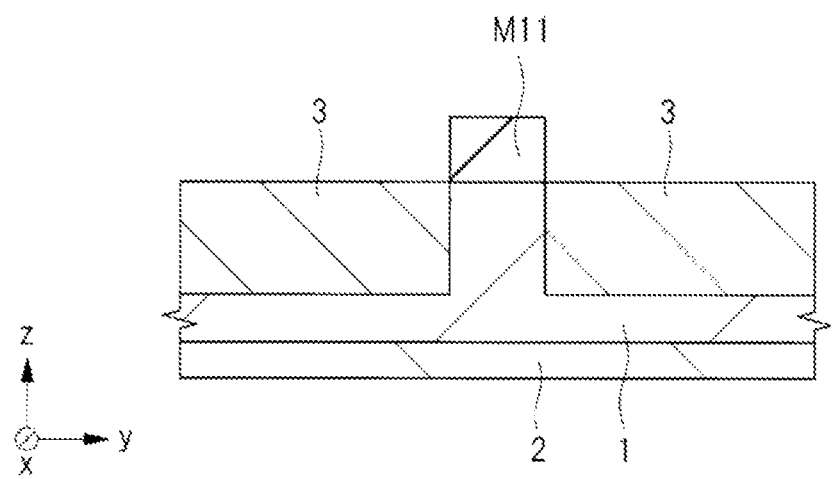
FIG. 7 is a cross sectional view illustrating the silicon carbide semiconductor device in manufacturing processes following the FIG. 6.

Then, as depicted in FIG. 7, a mask M11 is formed as an ion implantation blocking mask on the surface (upper face) of the epitaxial layer 1. The thickness of the mask M11 is, for example, approximately 1 to 3 μm. The width of the mask M11 in an element region is, for example, approximately 1 to 5 μm. As the material for the mask M11, a SiO$_2$ film, a Si film or a SiN film of an inorganic material or a resist film or a polyimide film of an organic material can be used.

Then, ion implantation of a p-type impurity (for example, Al (aluminum)) into the epitaxial layer 1 is performed through the mask M11. Consequently, a p-type body layer 3 is formed in the element region of the epitaxial layer 1. It is to be noted that, though not depicted, a p-type field limiting ring 103 (refer to FIG. 1) is simultaneously formed around the element region. The structure of the termination portion is not limited to this and may be, for example, a junction termination extension (JTE) structure.

The depth (first depth) of the body layer 3 from the surface (upper face) of the epitaxial layer 1 is, for example, approximately 0.5 to 2 μm. Further, the impurity concentration of the body layer 3 is, for example, $1 \times 10^{16}$ to $1 \times 10^{19}$ cm$^{-3}$. Further, the maximum impurity concentration of the body layer 3 is, for example, $1 \times 10^{17}$ to $1 \times 10^{19}$ cm$^{-3}$.

Figure 8:
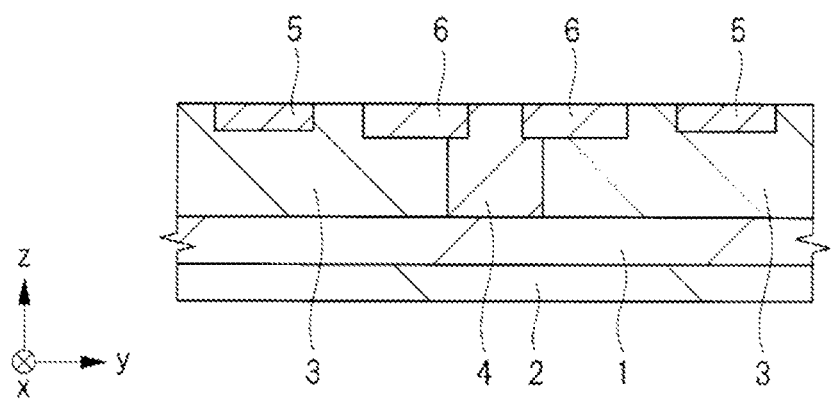
FIG. 8 is a cross sectional view illustrating the silicon carbide semiconductor device in manufacturing processes following the FIG. 7.

Then, after the mask M11 is removed, an n-type source region 5, an n-type current diffusion layer 6 or an n-type JFET region 4 is formed by a formation method similar to that for the body layer 3 as depicted in FIG. 8. In other words, such semiconductor regions are formed by an ion implantation method in which a mask is used or the like. The n-type impurity that is implanted here is, for example, N (nitrogen) or P (phosphorus). Further, though not depicted, an n-type guard ring 102 (refer to FIG. 1) is formed in a surrounding region.

<Step P3>

Then, though not depicted, a C (carbon) film is deposited on the upper face and the rear face of the epitaxial layer 1, for example, by a plasma CVD (Chemical Vapor Deposition) method. The thickness of the carbon film is, for example, approximately 0.03 μm. After the surface and the rear face of the SiC epitaxial substrate are covered with the carbon film, thermal treatment at a temperature equal to or higher than 1500° C. is performed for the SiC epitaxial substrate. The period of time of the heat treatment is, for example, approximately 1 to 30 minutes. By this, activation of the impurities having been ion-implanted into the SiC epitaxial substrate is performed. After the heat treatment, the carbon film is removed, for example, by oxygen plasma treatment.

<Step P4>

Figure 9:
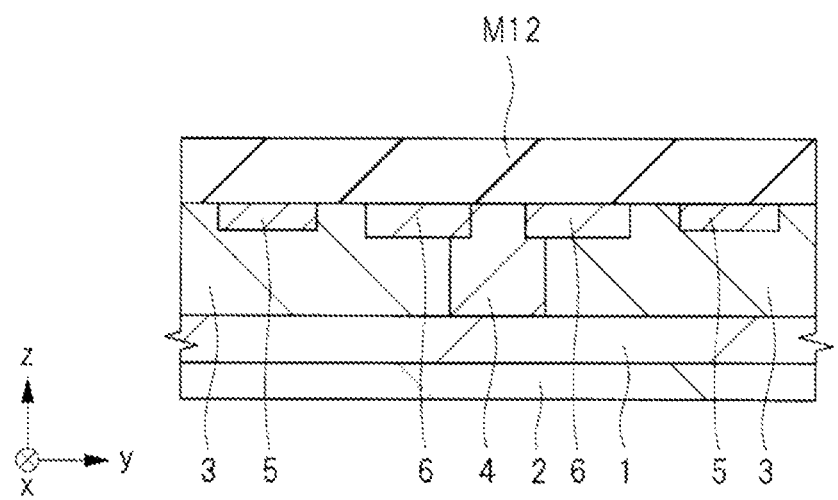
FIG. 9 is a cross sectional view illustrating the silicon carbide semiconductor device in manufacturing processes following the FIG. 8.
Figure 10:
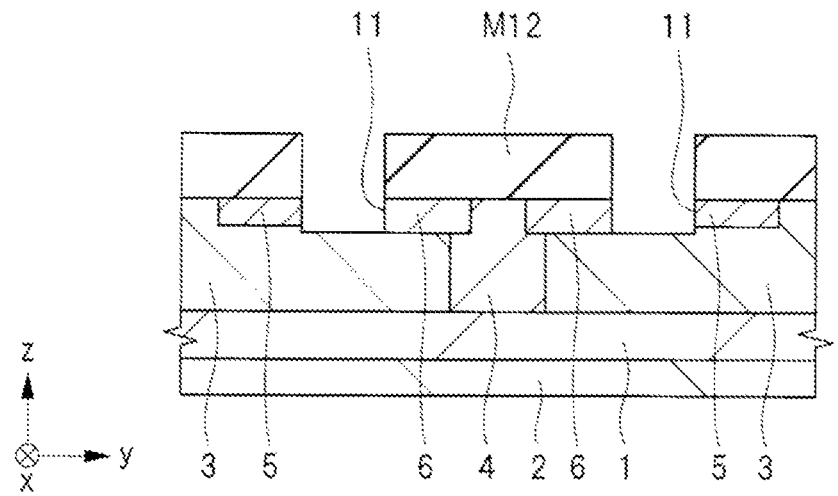
FIG. 10 is a cross sectional view illustrating the silicon carbide semiconductor device in manufacturing processes following the FIG. 9.

Then, a mask M12 is formed as an etching prevention mask on the epitaxial layer 1 as depicted in FIGS. 9 and 10. FIG. 9 is a sectional view of a region neighboring with a trench in the x direction, namely, a region in which no trench is formed, and FIG. 10 is a sectional view of a region in which a trench is to be formed. The mask M12 is formed, for example, from a resist film. The thickness of the mask M12 is, for example, approximately 0.5 to 3 μm. The mask M12 has openings provided in regions thereof in which trenches 11 are to be formed at a later step. At the bottom of one opening, for example, the body layer 3, source region 5 and current diffusion layer 6 are exposed.

Then, a plurality of trenches 11 extending to the source region 5, body layer 3 and current diffusion layer 6 are formed using a dry etching method. One trench 11 is in contact with the source region 5, body layer 3 and current diffusion layer 6. Here, a plurality of trenches 11 lined up in the x direction (depthwise direction in FIGS. 9 and 10) are formed. Further, a plurality of trenches 11 are formed in a lined up relationship also in the y direction (transverse direction in FIGS. 9 and 10).

The depth (fourth depth) of each trench 11 is smaller than the depth of the body layer 3. The depth of the trench 11 is, for example, approximately 0.1 to 1.5 μm. The length of the trench 11 in a direction (y direction) parallel to a channel length of a SiC power MISFET that is to be formed later is, for example, approximately 1 to 3 μm. The length of the trench 11 in a direction (x direction) parallel to the channel width of the SiC power MISFET is, for example, approximately 0.1 to 1 μm. The trench distance in the direction parallel to the channel width is, for example, approximately 0.1 to 1 μm.

<Step P5>

Figure 11:
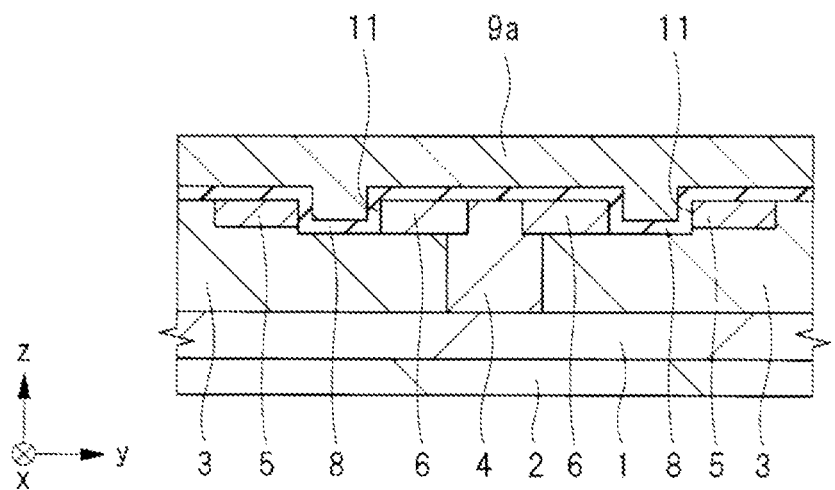
FIG. 11 is a cross sectional view illustrating the silicon carbide semiconductor device in manufacturing processes following the FIG. 10.

Then, after the mask M12 is removed, a gate insulating film 8 is formed on the surface of the epitaxial layer 1 and the surface of the trenches 11 as depicted in FIG. 11. In short, the gate insulating film 8 is formed so as to cover the side faces and the bottom face of the trenches 11. The gate insulating film is configured from a $SiO_2$ film formed, for example, by a thermal CVD method. The thickness of the gate insulating film 8 is, for example, approximately 0.005 to 0.15 μm. Since the thickness of the gate insulating film 8 is smaller than one half the minimum width of the trench 11, the trench 11 is not embedded fully by the gate insulating film 8.

Then, an n-type polysilicon film 9a is formed on the gate insulating film 8. The thickness of the polysilicon film 9a is, for example, approximately 0.01 to 4 μm. Consequently, the inside of each trench 11 is fully filled with the gate insulating film 8 and the polysilicon film 9a.

Figure 12:
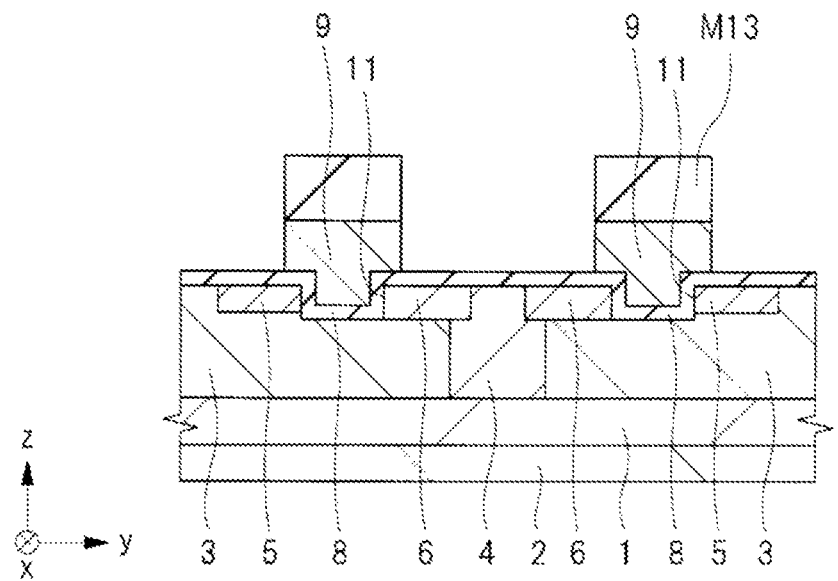
FIG. 12 is a cross sectional view illustrating the silicon carbide semiconductor device in manufacturing processes following the FIG. 11.

Then, the polysilicon film 9a is processed by a dry etching method using a mask M13 (photoresist film), a gate electrode 9 configured from the polysilicon film 9a is formed as depicted in FIG. 12. At this time, the polysilicon film 9a just above the JFET region 4 sandwiched between body layers 3 neighboring with each other in the y direction is removed.

Then, though not depicted, after the mask M13 is removed, the gate electrode 9 is light oxidized. For example, as a condition, dry oxidation is performed for approximately 30 minutes at 900° C.

<Step P6>

Figure 13:
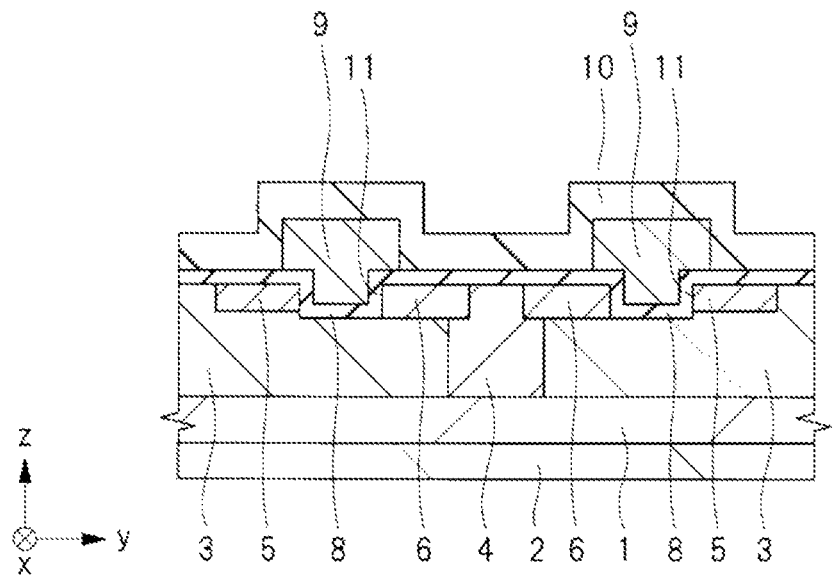
FIG. 13 is a cross sectional view illustrating the silicon carbide semiconductor device in manufacturing processes following the FIG. 12.

Then, an interlayer insulating film 10 is formed on the surface (upper face) of the epitaxial layer 1, for example, by a plasma CVD method such that it covers the gate electrode 9 and the gate insulating film 8 as depicted in FIG. 13. The interlayer insulating film is configured, for example, from a $SiO_2$ film.

Then, at steps described below with reference to FIGS. 14 to 17, a metal layer 7 and a metal silicide layer 14 are formed. Although it is described in the following description that a metal layer 7 and a metal silicide layer 14 are formed in such an order that the metal layer 7 is formed first and then the metal silicide layer 14 is formed, another method in which the metal layer 7 is formed after the metal silicide layer 14 is formed may be used or a further method in which the metal silicide layer 14 and the metal layer 7 are formed simultaneously may be used.

However, a layer configured from metal silicide is not formed as the metal layer 7 here. In particular, no metal silicide layer is formed on the current diffusion layer 6 and the JFET region 4. In other words, a conductive film that is connected by ohmic connection to the current diffusion layer 6 and the JFET region 4 is not formed on any of the current diffusion layer 6 and the JFET region 4. This is because the Schottky barrier diode described hereinabove that is configured from a metal layer 7 and an underlying n-type semiconductor region (current diffusion layer 6 and JFET region 4) is to be formed. In the case where a conductive film connected by ohmic connection to the current diffusion layer 6 and the JFET region 4 is formed on each of the current diffusion layer 6 and the JFET region 4, the conductive film and the current diffusion layer 6, JFET region 4, epitaxial layer 1 and SiC substrate 2 are short-circuited to each other, by which a device is obtained in which a SiC power MISFET that is formed later does not operate and besides the SiC power MISFET does not have a built-in diode. The built-in diode can be used as a reflux diode as described in connection with the embodiments 3 to 5 thereinafter described. Accordingly, the material of the metal layer 7 is restricted to a material that forms a Schottky junction to the epitaxial layer 1.

Figure 14:
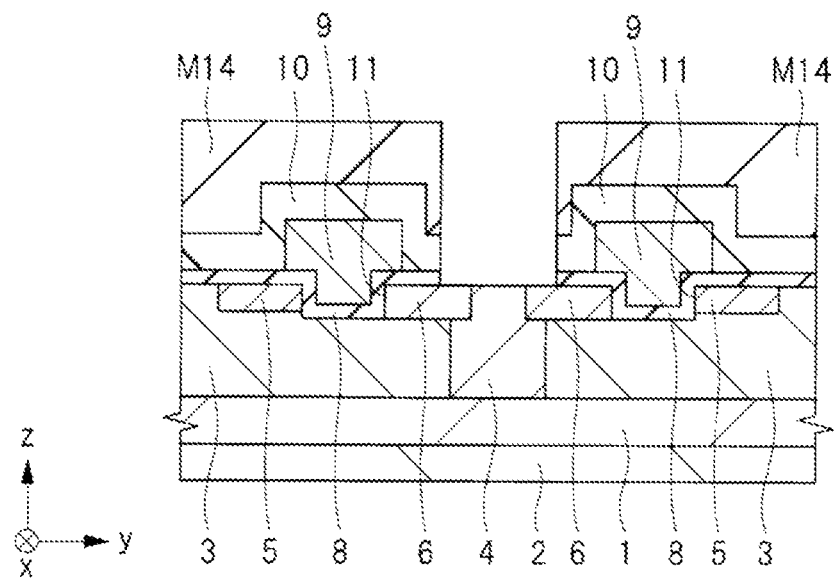
FIG. 14 is a cross sectional view illustrating the silicon carbide semiconductor device in manufacturing processes following the FIG. 13.

Here, as depicted in FIG. 14, the interlayer insulating film 10 and the gate insulating film 8 are processed by a dry etching method using a mask M14 (photoresist film) to form openings for exposing part of the current diffusion layer 6 and the JFET region 4.

Figure 15:
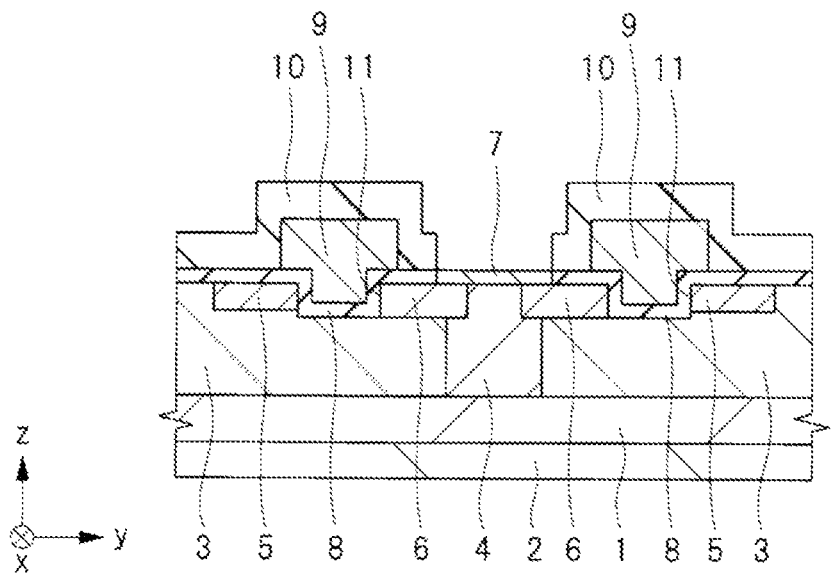
FIG. 15 is a cross sectional view illustrating the silicon carbide semiconductor device in manufacturing processes following the FIG. 14.

Then, after the mask M14 is removed, a metal layer 7 is formed which contacts with the surface of part of the current diffusion layer 6 and the JFET region 4 exposed to the bottom face of the openings as depicted in FIG. 15. The metal layer 7 is formed, for example, by deposition of a Ti (titanium) film, and the thickness of the metal layer 7 is, for example, approximately 0.001 to 5 µm. The Ti film can be formed, for example, by a sputtering method, and by thereafter processing the Ti film by performing etching using a mask, the metal layer 7 formed from a Ti film remains as a pattern between two gate electrodes 9. The current diffusion layer 6 and JFET region 4 and the metal layer 7 configure a Schottky barrier formed from a Schottky junction.

Figure 16:
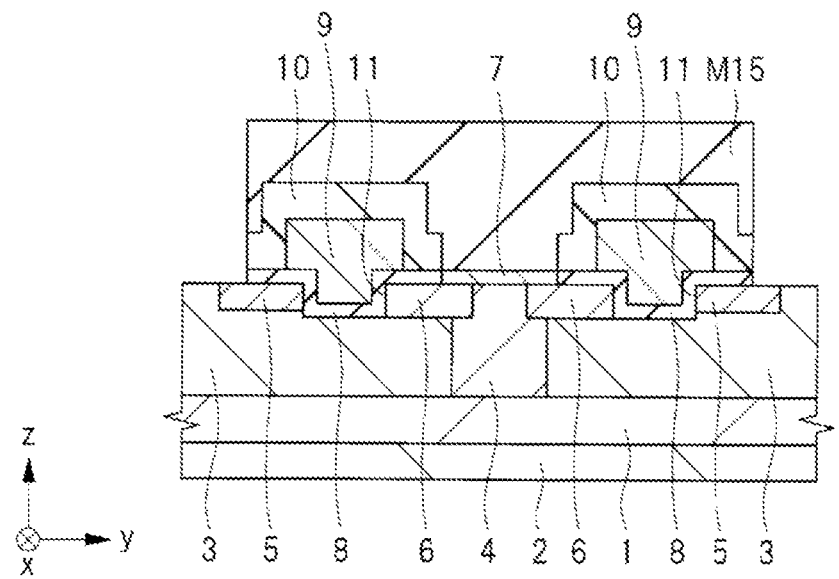
FIG. 16 is a cross sectional view illustrating the silicon carbide semiconductor device in manufacturing processes following the FIG. 15.

Thereafter, the interlayer insulating film 10 and the gate insulating film 8 are processed by a dry etching method using a mask M15 (photoresist film) to form openings that extend to part of the source region 5 and the body layer 3 as depicted in FIG. 16. The mask M15 covers the metal layer 7.

Figure 17:
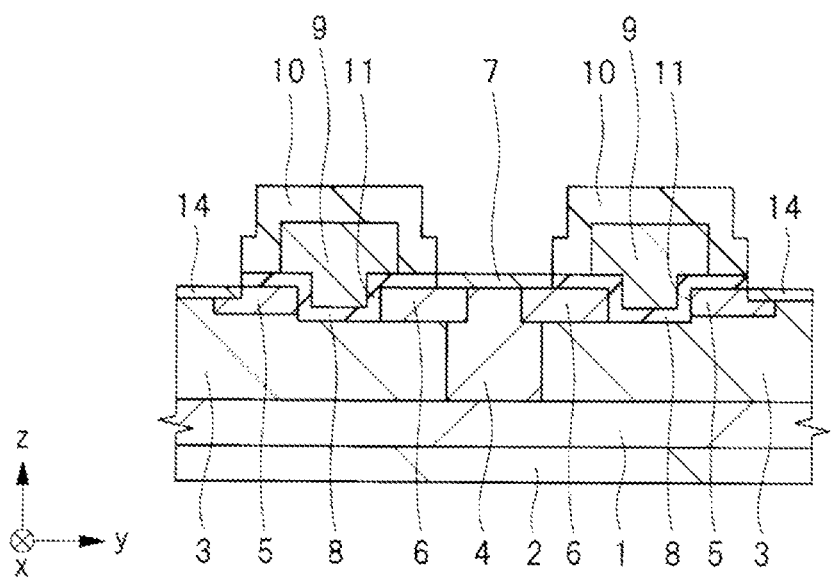
FIG. 17 is a cross sectional view illustrating the silicon carbide semiconductor device in manufacturing processes following the FIG. 16.

Then, after the mask M15 is removed, a metal silicide layer 14 is formed on the upper face of each of part of the source region 5 and part of the body layer 3, which are exposed to the bottom face through the openings, using a well-known salicide process as depicted in FIG. 17.

<Step P7>

Figure 18:
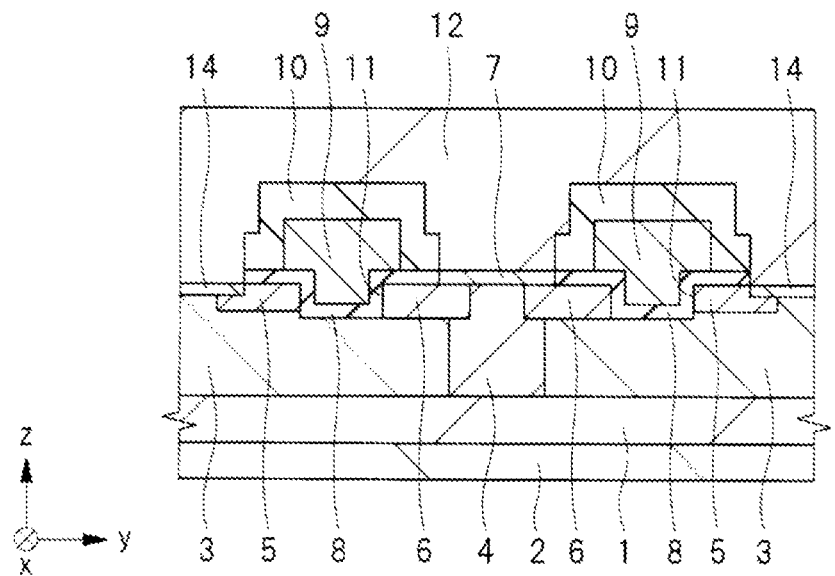
FIG. 18 is a cross sectional view illustrating the silicon carbide semiconductor device in manufacturing processes following the FIG. 17.

Thereafter, a metal film (stacked film including, for example, a Ti (titanium) film, a TiN (titanium nitride) film and an Al (aluminum) film) is deposited on the interlayer insulating film 10 including the inside of a plurality of openings (an opening that extends to the gate electrode 9 is not depicted) that extend to the metal silicide layer 14, metal layer 7 and gate electrode 9 that cover the source region 5 as depicted in FIG. 18. The thickness of the Al (aluminum) film preferably is, for example, 2 µm or more. Then, the metal layer is processed to form a source electrode 12, which is electrically connected to the source region 5 and the body layer 3 through the metal silicide layer 14 and is electrically connected to the metal layer 7, and a gate wiring electrode (not depicted) electrically connected to the gate electrode 9.

Then, though not depicted, a SiO$_2$ film or a polyimide film is deposited as a passivation film such that it covers the gate wiring electrode and the source electrode 12.

Then, though not depicted, the passivation film is processed to form a source opening 107 (refer to FIG. 1) and a gate opening 105 (refer to FIG. 1) that extend through the passivation film.

Then, though not depicted, a metal film is deposited on the rear face of the SiC substrate 2, for example, by a sputtering method. The thickness of the metal layer is, for example, approximately 0.1 µm.

Figure 19:
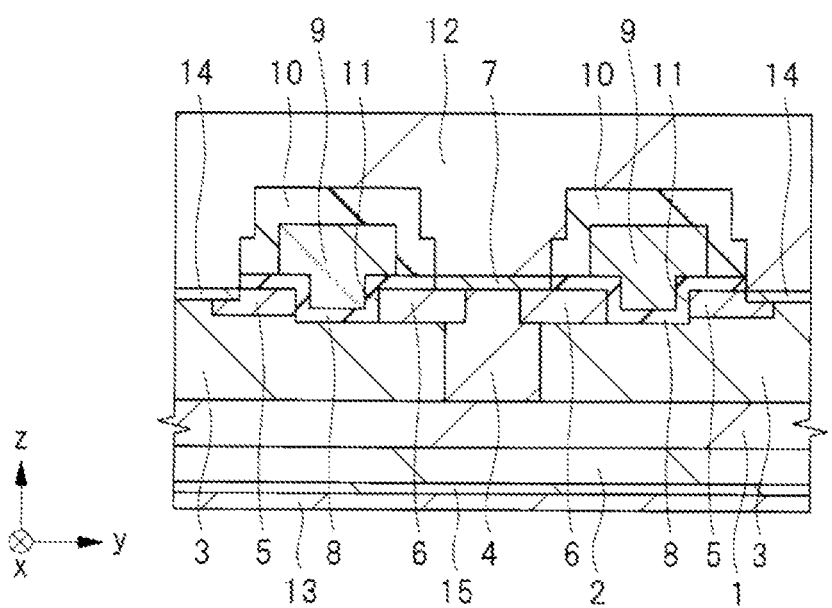
FIG. 19 is a cross sectional view illustrating the silicon carbide semiconductor device in manufacturing processes following the FIG. 18.

Then, laser silicidation heat treatment is performed to cause the metal film and the rear face of the SiC substrate 2 to react with each other to form a metal silicide layer 15 such that it covers the rear face of the SiC substrate 2 as depicted in FIG. 19. Thereafter, a drain wiring electrode 13 is formed so as to cover the lower face of the metal silicide layer 15. The drain wiring electrode 13 is configured from a stacked film formed by stacking a Ti (titanium) film, a Ni (nickel) film and an Au (gold) film in order in the downward direction. The thickness of the drain wiring electrode 13 is, for example, approximately 0.5 to 1 µm.

By the steps described above, the silicon carbide semiconductor device of the present invention is substantially completed. The n-type source region 5, the p-type body layer 3, the n-type current diffusion layer 6, JFET region 4, epitaxial layer 1 and SiC substrate 2 and the gate electrode 9 configure a SiC power MISFET 108 (refer to FIG. 1). Thereafter, external wiring lines are electrically connected to the source electrode 12, gate wiring electrode and drain wiring electrode 13.

<Advantageous Effect of Fabrication Method of Silicon Carbide Semiconductor Device of Present Embodiment>

According to the present embodiment, since a side face of the trench 11 becomes a channel region, for example, in the case where a 4° off Si (0001) plane substrate is used, the (11-20) plane or the (1-100) plane can be utilized as a channel region. Accordingly, a high channel mobility can be implemented in comparison with a SiC power MISFET that has only a main face of a SiC epitaxial substrate as a channel region. Further, by forming the trench 11, the channel width becomes great in comparison with that of a DMOS structure in which no trench is formed, and a high current concentration can be implemented. Therefore, a performance of the silicon carbide semiconductor device can be improved.

Further, the trench 11 is formed in a region shallower than the depth of the body layer 3, and a portion lower than the bottom of the trench 11 is surrounded by the body layer 3. Accordingly, in the present embodiment, an electric field to be applied to the gate insulating film formed on the trench surface upon holding of the withstanding voltage can be moderated significantly in comparison with a trench type MOS structure in which some portion is exposed downwardly from the body layer 3. Therefore, the reliability of the silicon carbide semiconductor device can be improved.

Further, in the present embodiment, since only free electrons exist as carriers in the metal layer 7 connected to the upper face of the current diffusion layer 6, in the case where current flows to the n-type current diffusion layer 6, occurrence of energization deterioration can be suppressed irrespective of whether or not a BPD exists in the drift layer. Therefore, since the resistance and the loss can be reduced in comparison with those of an ordinary DMOS structure, a performance of the silicon carbide semiconductor device can be improved. Consequently, a silicon carbide semiconductor device having high reliability can be formed.

Further, since the metal layer 7 and the source electrode 12 here can be produced at successive steps after formation of the interlayer insulating film 10, the process is simple and easy.

Modification 1

Figure 21:
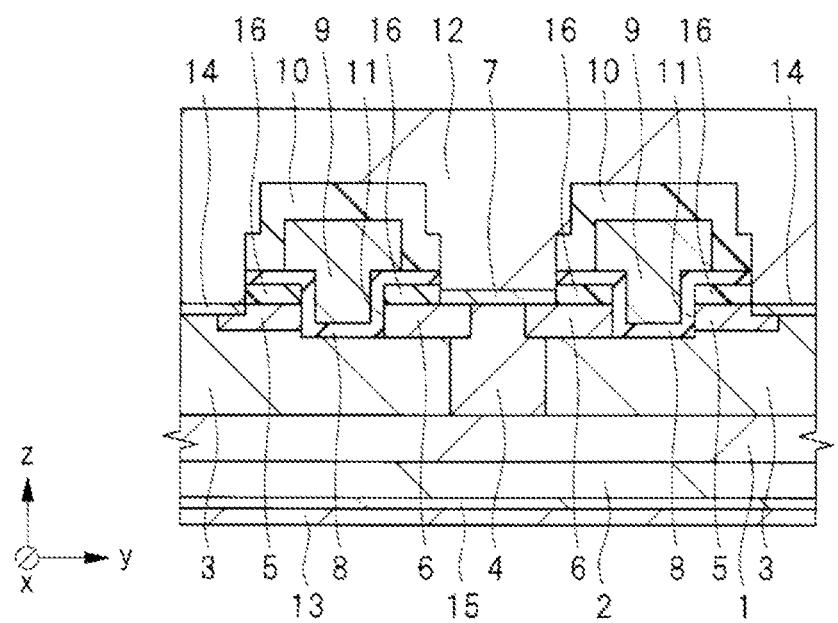
FIGS. 21, 22, 23 and 24 are cross sectional views depicting silicon carbide semiconductor devices of modifications 1, 2, 3 and 4 according to the embodiment 1 of the present invention, respectively.

As depicted in FIG. 21, in a SiC power MISFET of a modification 1 to the present embodiment, a field oxide film (field insulating film) 16 that is thicker than the gate insulating film 8 is formed in each of a region sandwiched between an upper portion of the current diffusion layer 6 and the gate insulating film 8 and a region sandwiched between an upper portion of the source region 5 and the gate insulating film 8. The structure of the other part of the SiC power MISFET is similar to that of the SiC power MISFET described with reference to FIG. 4. Since the field oxide film 16 is formed, a gate insulating film electric field that is applied in an off state can be further reduced. In addition, it is possible to decrease the electric capacitance between the gate electrode 9 and the epitaxial layer 1, and further, the etching loss can be reduced and erroneous firing can be prevented.

In the formation method of the field oxide film 16, for example, a hard mask (mask M12) used, for example, at the formation stage of a trench 11 described hereinabove with reference to FIG. 10 is left as the field oxide film 16. In this case, the source electrode 12 is formed from a silicon oxide film. Consequently, the field oxide film 16 and the gate insulating film 8 stacked in order are sandwiched between an angular portion that is an upper portion of a side face of the trench 11 and the gate electrode 9, and a resulting structure has a thick oxide film thickness.

Modification 2

Figure 22:
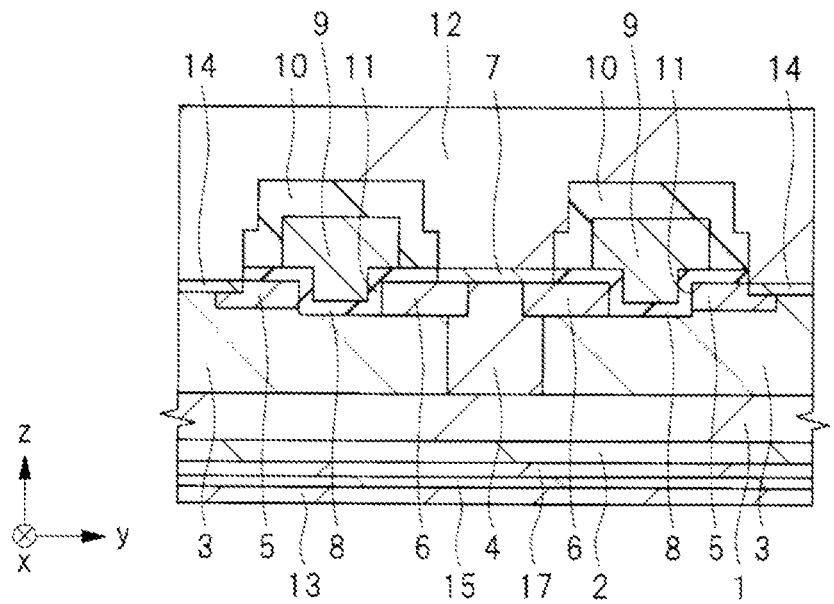

As depicted in FIG. 22, in a modification 2 to the present embodiment, a resistance reduction layer 17 that is an n-type semiconductor layer having a high impurity concentration is formed on the rear face of the SiC substrate 2 such that it has a predetermined depth (fifth depth) from the rear face (second main face) of the SiC substrate 2. Consequently, the resistance of the metal silicide layer 15 can be reduced, and the contact resistance between the SiC substrate 2 and the drain wiring electrode 13 can be reduced. The structure of the other part is similar to that of the SiC power MISFET described hereinabove with reference to FIGS. 1 to 4.

The resistance reduction layer 17 is formed by ion implantation, for example, immediately before the step described hereinabove with reference to FIG. 19. The n-type impurity concentration of the resistance reduction layer 17 is, for example, $1 \times 10^{19}$ to $1 \times 10^{21}$ cm$^{-3}$. The resistance reduction layer 17 may be formed by an epitaxial growth method.

Modification 3

Figure 23:
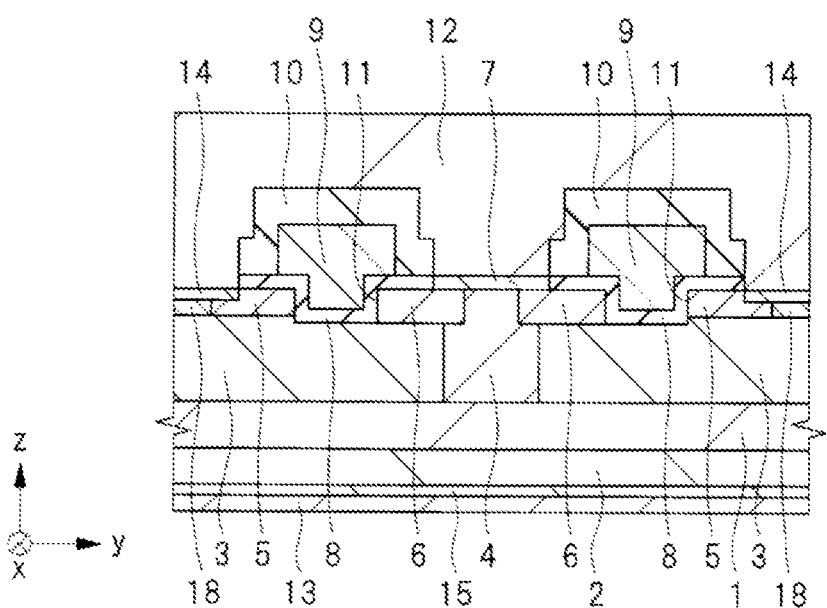

As depicted in FIG. 23, in a modification 3 to the present embodiment, a potential fixation region 18 of the body layer is formed in a region sandwiched between the p-type body layer 3 and the metal silicide layer 14. In short, the potential fixation region 18 that is a p-type semiconductor region is formed on an upper face of the epitaxial layer 1 (upper face of the body layer 3) in a neighboring relationship with the source region 5. Consequently, the resistance of the metal silicide layer 14 can be reduced, and the potential of the body layer 3 becomes equal to that of the source electrode 12. The structure of the other part is similar to that of the SiC power MISFET described hereinabove with reference to FIGS. 1 to 4.

The potential fixation region 18 provided in order to fix the potential of the body layer is formed, for example, by ion implantation of a p-type impurity into the body layer 3. The depth of the potential fixation region 18 from the surface (upper face) of the body layer 3 is, for example, approximately 0.1 to 0.5 μm. The impurity concentration of the potential fixation region 18 is, for example, $1 \times 10^{19}$ to $1 \times 10^{21}$ cm$^{-3}$. The potential fixation region 18 has an impurity concentration higher than that of the body layer 3.

Modification 4

Figure 24:
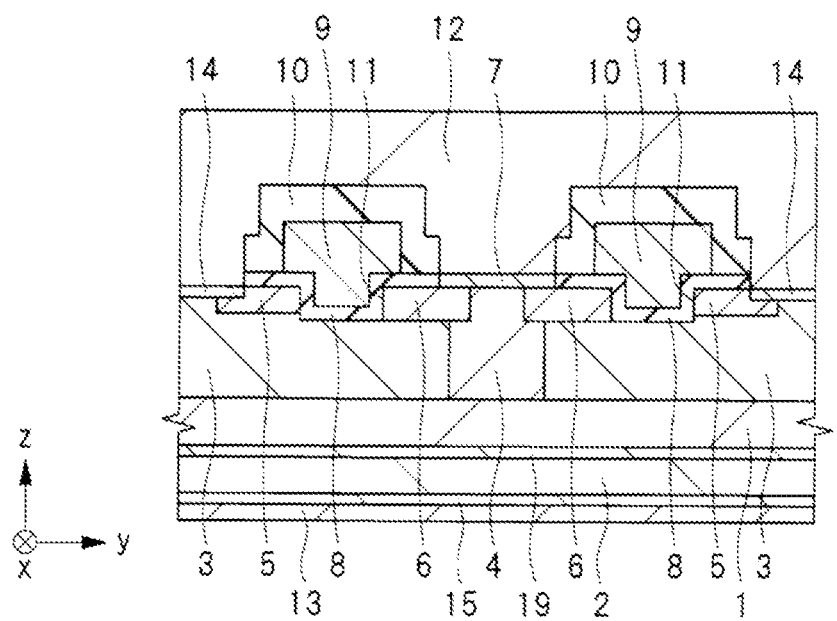

As depicted in FIG. 24, in a modification 4 to the present embodiment, a BPD reduction layer 19 that is an n-type semiconductor layer is formed in a region sandwiched between the n-type epitaxial layer 1 and the n-type SiC substrate 2. Consequently, part of a BPD existing in the SiC substrate 2 changes to a TSD (Threading Screw Dislocation), and the BPD in the epitaxial layer 1 can be reduced significantly. The TSD is a dislocation that, different from the BPD, does not become resistance when current flows to the SiC power MISFET. Accordingly, by changing the BPD into the TSD, it is possible to further reduce the on resistance of the SiC power MISFET and prevent occurrence of energization deterioration. The structure of the other part is similar to that of the SiC power MISFET described hereinabove with reference to FIGS. 1 to 4.

The BPD reduction layer 19 can be formed, for example, in the process described hereinabove with reference to FIG. 6, by an epitaxial growth method before the epitaxial layer 1 is formed on the SiC substrate 2. The preferred range of the impurity concentration of the BPD reduction layer 19 is, for example, $1 \times 10^{17}$ to $1 \times 10^{21}$ cm$^{-3}$. The BPD reduction layer 19 is a layer that has, for example, an impurity concentration higher than that of the SiC substrate 2 but lower than that of the epitaxial layer 1. The thickness of the BPD reduction layer 19 is, for example, approximately 0.5 to 50 μm.

Embodiment 2

Figure 25:
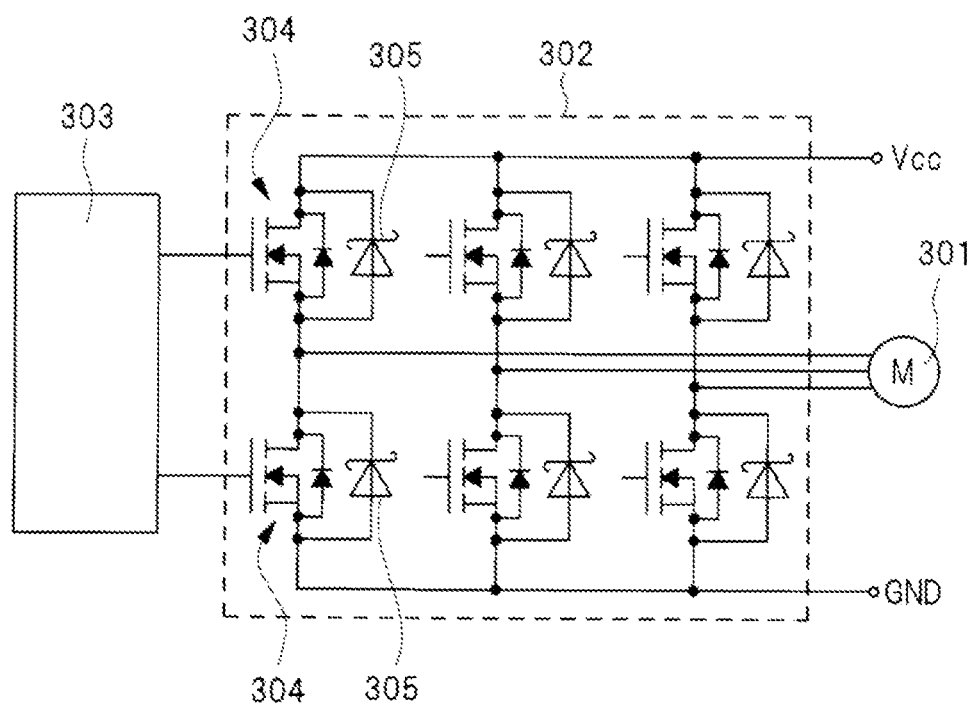
FIG. 25 is a circuit diagram depicting a power conversion apparatus according to an embodiment 2 of the present invention.

The silicon carbide semiconductor device including the SiC power MISFET described hereinabove in connection with the embodiment 1 can be used in a power conversion apparatus. The power conversion apparatus according to the present embodiment 2 is described with reference to FIG. 25. FIG. 25 is a circuit diagram depicting an example of the power conversion apparatus (inverter) according to the present embodiment.

As depicted in FIG. 25, the inverter 302 includes a SiC MISFET 304 that is a switching element, and a diode 305. The SiC MISFET 304 is the SiC power MISFET described hereinabove in connection with the embodiment 1 and includes a built-in diode. In each single phase, a SiC MISFET 304 and a diode 305 are connected in antiparallel between a power supply voltage (Vcc) and an input potential to a load (for example, a motor) 301 (upper arm), and a SiC MISFET 304 and a diode 305 are connected in antiparallel also between the input potential to the load 301 and a ground potential (GND) (lower arm).

In particular, in the inverter 302, two SiC MISFETs 304 and two diodes 305 are provided for each phase, and six SiC MISFETs (switching elements) 304 and six diodes 305 are provided for three phases. A control circuit 303 is connected to the gate electrode of the SiC MISFETs 304 such that the SiC MISFETs 304 are controlled by the control circuit 303. Accordingly, the control circuit 303 can drive the load 301 by controlling current to flow to the SiC MISFETs 304 configuring the inverter 302. The SiC MISFET 304 and the diode 305 connected in antiparallel to each other are, for example, separate elements from each other and are not incorporated in a mixed manner in a same semiconductor chip.

The function of the SiC MISFETs 304 configuring the inverter 302 is described below. In order to control and drive the load 301 that is, for example, a motor, it is necessary to input a sine wave of a desired voltage to the load 301. The control circuit 303 controls the SiC MISFETs 304 to perform pulse width modulation operation for dynamically changing the pulse width of the rectangular wave. The outputted rectangular wave is, when it passes an inductor, smoothed into a pseudo sine wave. The SiC MISFETs 304 have a function for producing a rectangular wave for performing this pulse width modulation operation.

In this manner, according to the present embodiment, the silicon carbide semiconductor device having a low on resistance and a high withstanding voltage described hereinabove in connection with the embodiment 1 is used for the SiC MISFETs 304. Since the SiC MISFETs 304 have a high performance, a power conversion apparatus such as an inverter having a high performance can be achieved. Further, since the SiC MISFETs 304 have long-term reliability, years of use of a power conversion apparatus such as an inverter can be increased.

Further, the power conversion apparatus can be used for a three-phase motor system. In the case where the load 301 depicted in FIG. 25 is a three-phase motor, if the power conversion apparatus including the silicon carbide semiconductor device described hereinabove in connection with the embodiment 1 is used, then a high performance and increase of the years of use of the three-phase motor system can be implemented.

Embodiment 3

Figure 26:
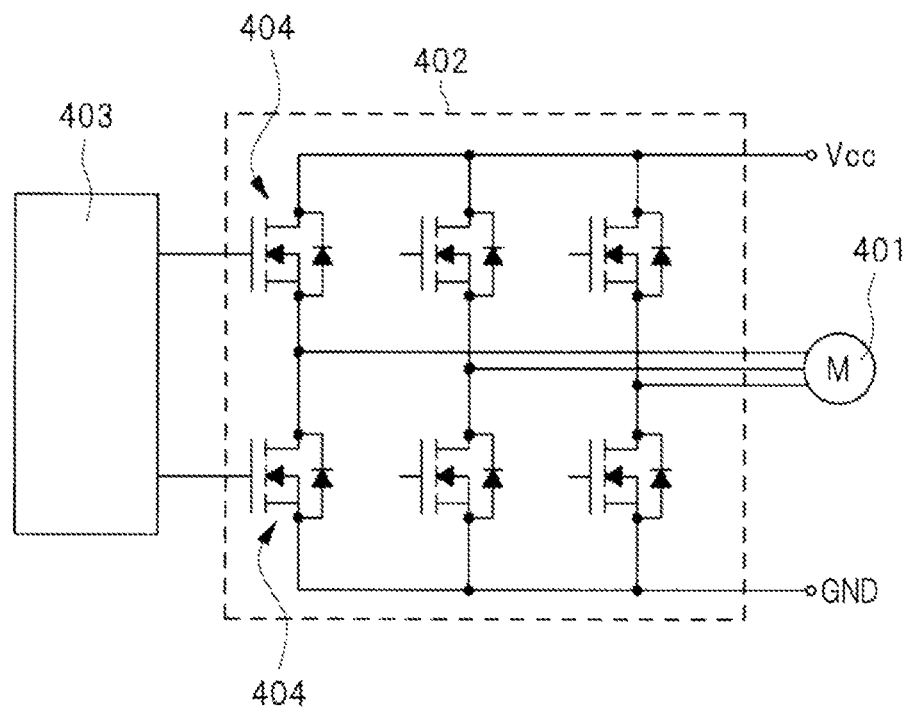
FIG. 26 is a circuit diagram depicting a power conversion apparatus according to an embodiment 3 of the present invention.

The silicon carbide semiconductor device including the SiC power MISFET described hereinabove in connection with the embodiment 1 can be used for a power conversion apparatus. The power conversion apparatus in an embodiment 3 is described with reference to FIG. 26. FIG. 26 is a circuit diagram depicting an example of the power conversion apparatus (inverter) according to the present embodiment.

Referring to FIG. 26, the inverter 402 includes a SiC MISFET 404 that is a switching element. In each single phase, a SiC MISFET 404 is connected between a power supply voltage (Vcc) and an input potential to a load (for example, a motor) 401 (upper arm), and a SiC MISFET 404 is connected also between the input potential to the load 401 and a ground potential (GND) (lower arm). In particular, in the inverter 402, for each single phase, two SiC MISFETs 404 are provided, and for three phases, six SiC MISFETs (switching elements) 404 are provided. To the gate electrode of the individual SiC MISFETs 404, a control circuit 403 is connected such that the SiC MISFETs 404 are controlled by the control circuit 403. Accordingly, the control circuit 403 can drive the load 401 by controlling current to flow to the SiC MISFETs 404 configuring the inverter 402.

The function of the SiC MISFETs 404 configuring the inverter 402 is described below. Also in the present embodiment, as one of functions of the SiC MISFETs, the SiC MISFET has a function for producing a rectangular wave for performing pulse width modulation operation similar to that in the embodiment 2. Further, in the present embodiment, the SiC MISFET has a role also as the diode 305 in the embodiment 2. In the inverter 402, for example, in the case where the load 401 includes an inductance like that in a motor, when the SiC MISFET 404 is turned off, the energy stored in the inductance must be released without fail (reflux current). In the embodiment 2, the diode 305 plays this role. In this manner, the diode 305 is used as a reflux diode. In contrast, in the present embodiment, this role is played by the SiC MISFET 404. In other words, synchronous rectification drive is used. Here, the synchronous rectification drive is a method of turning on, when reflux is done, the gate of the SiC MISFET 404 such that it conducts reversely.

Accordingly, the conduction loss at reflux depends not upon a characteristic of the diode but upon a characteristic of the SiC MISFET 404. Further, in the case where synchronous rectification drive is to be performed, in order to prevent the upper and lower arms from short-circuiting to each other, an inactivity period of time during which both of the SiC MISFETs of the upper and lower arms are off is required. During this inactivity period of time, a Schottky barrier diode formed from the JFET region 4 of the SiC MISFET 404 and the metal layer 7 (refer to FIG. 2) conducts. In other words, this Schottky diode (built-in diode) is used as a reflux diode in place of the diode 305 in the embodiment 2.

In this manner, according to the present embodiment, by using the silicon carbide semiconductor device described hereinabove in connection with the embodiment 1 for the SiC MISFET 404, the loss at reflux can be reduced, for example, because the SiC MISFET 404 has a high performance. Further, since no diode is used except the SiC MISFET 404, the power conversion apparatus such as an inverter can be scaled down. Furthermore, since the SiC MISFET 404 has long-term reliability, years of use of the power conversion apparatus such as an inverter can be increased.

Further, the power conversion apparatus can be used for a three-phase motor system. In the case where the load 401 depicted in FIG. 26 is a three-phase motor, if the power conversion apparatus including the silicon carbide semiconductor device described hereinabove in connection with the embodiment 1 is used for the inverter 402, then a high performance and increase of years of use of the three-phase motor system can be implemented.

Embodiment 4

Figure 27:
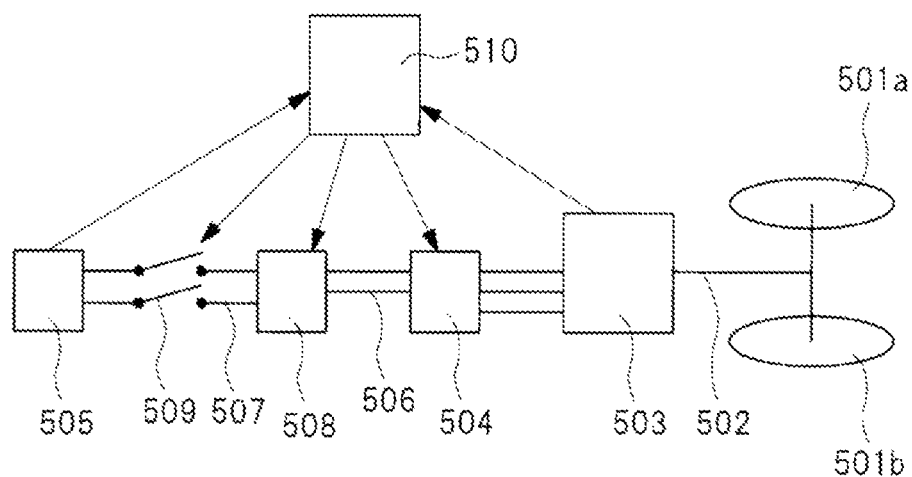
FIG. 27 is a schematic view depicting a configuration of an electric automobile according to an embodiment 4 of the present invention.

The three-phase motor system described hereinabove in connection with the embodiment 2 or 3 can be used in an automobile such as a hybrid car, an electric car or a fuel cell vehicle. An automobile that uses the three-phase motor system according to an embodiment 4 is described with reference to FIGS. 27 and 28. FIG. 27 is a block diagram depicting an example of a configuration of an electric car according to the present embodiment, and FIG. 28 is a circuit diagram depicting an example of a boost converter in the present embodiment.

Referring to FIG. 27, the electric car includes a three-phase motor 503 that can input and output power to and from a drive shaft 502 to which a driving wheel (wheel) 501a and another driving wheel (wheel) 501b are connected, an inverter 504 for driving the three-phase motor 503, and a battery 505. The electric car further includes a boost converter 508, a relay 509 and an electronic controlling unit 510. The boost converter 508 is connected to a power line 506 to which the inverter 504 is connected and another power line 507 to which the battery 505 is connected.

The three-phase motor 503 is a synchronous generator motor including a rotor in which permanent magnets are embedded and a stator on which three-phase coils are wound. For the inverter 504, the inverter described hereinabove in connection with the embodiment 2 or 3 can be used. The synchronous generator motor receives supply of power from the inverter and drives the driving wheels 501a and 501b.

Figure 28:
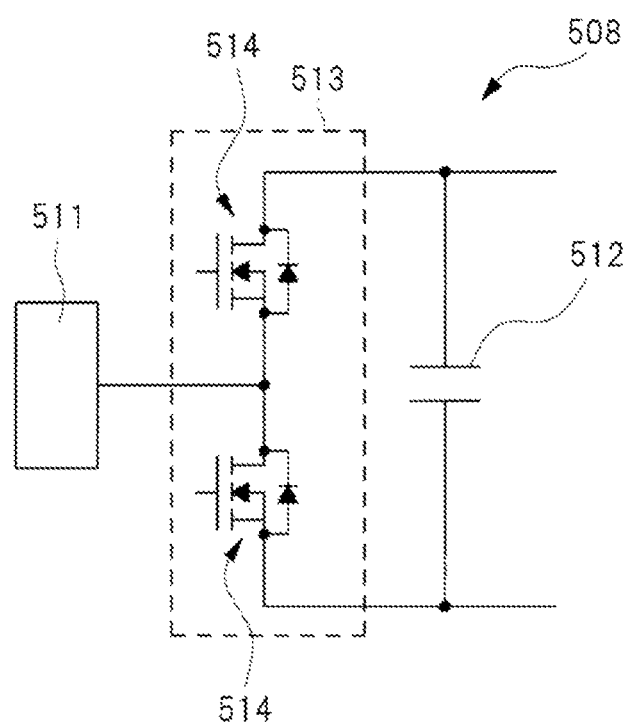
FIG. 28 is a circuit diagram of a boosting converter according to the embodiment 4 of the present invention.

The boost converter 508 is configured such that a reactor 511 and a smoothing capacitor 512 are connected to an inverter 513 as depicted in FIG. 28. The inverter 513 is similar to the inverter described hereinabove in connection with the embodiment 3 and is same also in element configuration in the inverter. In the present embodiment, the inverter 513 is depicted such that it is configured, for example, from a SiC MISFET 514 similarly as in the embodiment 3.

The electronic controlling unit 510 of FIG. 27 includes a microprocessor, a storage device, and input/output ports, and receives a signal from a sensor for detecting the rotor position of the three-phase motor 503, a charge/discharge value of the battery 505 and so forth. The electronic controlling unit 510 thus outputs signals for controlling the inverter 504, boost converter 508 and relay 509.

In this manner, according to the present embodiment, the power conversion apparatus described hereinabove in connection with the embodiment 2 or 3 can be used for the inverter 504 and the boost converter 508 that are power conversion apparatus. Further, for the three-phase motor system including the three-phase motor 503 and the inverter 504, the three-phase motor system described hereinabove in connection with the embodiment 2 or 3 can be used. Consequently, energy saving, scaling down, reduction in weight and reduction in space of the electric car can be achieved.

It is to be noted that, while the present embodiment is described above in connection with an electric car, the three-phase motor system of any of the embodiments described above can be applied similarly also to a hybrid car that uses also an engine and a fuel cell vehicle in which the battery 505 is a fuel cell stack.

Embodiment 5

Figure 29:
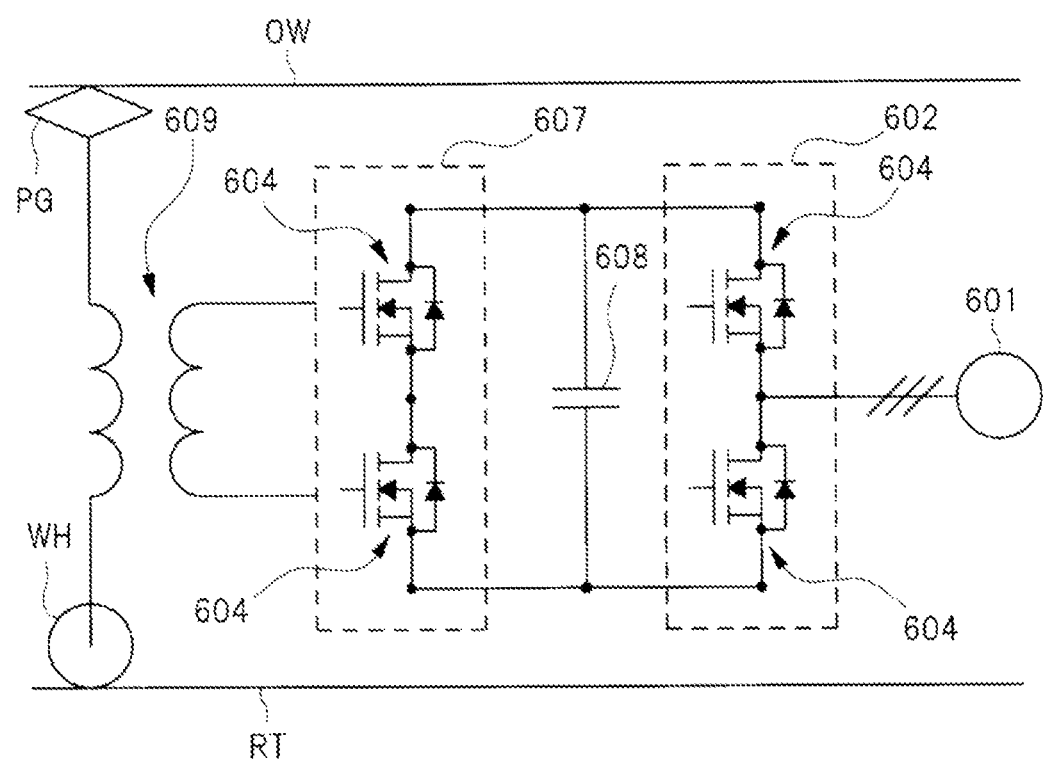
FIG. 29 is a circuit diagram depicting a converter and an inverter of a railway vehicle according to an embodiment 5 of the present invention.

The three-phase motor system described hereinabove in connection with the embodiment 2 or 3 can be used in a railway car. A railway car that uses the three-phase motor system in an embodiment 5 is described with reference to FIG. 29. FIG. 29 is a circuit diagram depicting an example of a converter and an inverter provided in the railway car in the present embodiment.

As depicted in FIG. 29, to the railway car, power is supplied from an overhead wire OW (for example, 25 kV) through a pantograph PG. The voltage is stepped down to 1.5 kV through a transformer 609, and the power is converted from alternating current (AC) power to direct current (DC) power by a converter 607. Further, the power is converted from DC power to AC power by an inverter 602 via a capacitor 608 and drives a three-phase motor that is a load 601. In other words, the three-phase motor (electric motor) that is the load 601 receives supply of power from the inverter 602 and drives wheels WH.

As an element configuration in the converter 607, both of a SiC MISFET and a diode may be used similarly as in the embodiment 2 or a SiC MISFET may be used solely as in the embodiment 3. In the present embodiment, the converter 607 is depicted such that it is configured from the SiC MISFET 604, for example, similarly as in the embodiment 3. It is to be noted that, in FIG. 29, the control circuit described hereinabove in connection with the embodiment 2 or 3 is omitted. Further, in FIG. 29, reference character RT denotes a railway track. The overhead wire OW and the railway track RT are electrically connected to each other through the pantograph PG, transformer 609 and wheel WH.

In this manner, according to the present embodiment, the power conversion apparatus described hereinabove in connection with the embodiment 2 or 3 can be used for the converter 607. Further, for the three-phase motor including the load 601, inverter 602 and control circuit, the three-phase motor system described hereinabove with reference to the embodiment 2 or 3 can be used. Consequently, energy saving of a railway car and scaling down and reduction in weight of underfloor parts can be achieved.

While the invention made by the inventors has been described particularly in connection with the embodiments, it is a matter of course that the present invention is not limited to the embodiments described above but the embodiments can be altered and modified in various manners without departing from the subject matter of the present invention.

What is claimed is:
1. A silicon carbide semiconductor device, comprising:
an n-type silicon carbide semiconductor substrate having a first impurity concentration;
a drain electrode electrically connected to a rear face of the silicon carbide semiconductor substrate;
an n-type semiconductor layer formed on the silicon carbide semiconductor substrate and having a second impurity concentration lower than the first impurity concentration;
a p-type first semiconductor region formed from an upper face of the semiconductor layer to the inside of the semiconductor layer;
an n-type second semiconductor region formed from an upper face of the first semiconductor region to the inside of the first semiconductor region;
an n-type third semiconductor region formed from the upper face of the semiconductor layer to the inside of the semiconductor layer, held in contact with the first semiconductor region and electrically connected to the semiconductor layer;
a trench formed shallower than the first semiconductor region on the upper face of the first semiconductor region and having a first side face and a second side face opposing to each other and a third side face intersecting with the first side face and the second side face;
a gate electrode formed in the trench with a gate insulating film interposed therebetween;
a metal layer formed in contact with an upper face of the third semiconductor region and electrically connected to the third semiconductor region; and
a source electrode formed on the semiconductor layer and electrically connecting the second semiconductor region and the metal layer to each other, wherein
the first side face contacts with the second semiconductor region and the second side face contacts with the third semiconductor region while the third side face contacts with the first semiconductor region.

2. The silicon carbide semiconductor device according to claim 1, wherein
the third semiconductor region and the metal layer are joined together by a Schottky junction.

3. The silicon carbide semiconductor device according to claim 2, wherein
the metal layer is formed from a Ti film or a Ni film.

4. The silicon carbide semiconductor device according to claim 1, wherein a portion of the third semiconductor region at which the third semiconductor region contacts with the metal layer has a potential equal to that of the second semiconductor region.

5. The silicon carbide semiconductor device according to claim 1, wherein
crystal planes of the first side face and the second side face of the trench with which the first semiconductor region contacts are a (11-20) plane or a (1-100) plane.

6. The silicon carbide semiconductor device according to claim 1, wherein
the metal layer, the third semiconductor region and the first semiconductor region overlap with each other as viewed in plan.

7. The silicon carbide semiconductor device according to claim 1, wherein
the metal layer has a thickness of 0.001 to 5 μm.

8. The silicon carbide semiconductor device according to claim 1, further comprising:
a field insulating film formed between the gate insulating film and the semiconductor layer and having a thickness greater than that of the gate insulating film.

9. The silicon carbide semiconductor device according to claim 1, further comprising:
an n-type fourth semiconductor region formed from the upper face of the semiconductor layer to the inside of the semiconductor region and held in contact with the third semiconductor region, wherein
the fourth semiconductor region is electrically connected to the semiconductor layer and the third semiconductor region and has an impurity concentration higher than that of the semiconductor layer but lower than that of the first semiconductor region.

10. The silicon carbide semiconductor device according to claim 9, wherein
an upper face of the fourth semiconductor region and the metal layer are joined together by a Schottky junction.

11. A power conversion apparatus, comprising:
a switching element formed from the silicon carbide semiconductor device according to claim 1.

12. An automobile, comprising:
a wheel driven by electric power supplied from the power conversion apparatus according to claim 11.

13. A railway car, comprising:
a wheel driven by electric power supplied from the power conversion apparatus according to claim 11.

14. A fabrication method for a silicon carbide semiconductor device, comprising the steps of:
preparing a stacked substrate including an n-type silicon carbide semiconductor substrate and an n-type semiconductor layer formed on the silicon carbide semiconductor substrate;
forming a p-type first semiconductor region from an upper face of the semiconductor layer to the inside of the semiconductor region;
forming an n-type second semiconductor region from an upper face of the first semiconductor region to the inside of the first semiconductor region and forming an n-type third semiconductor region formed from the upper face of the semiconductor layer to the inside of the semiconductor layer, the third semiconductor region being spaced from the second semiconductor region with the first semiconductor region interposed therebetween, the third semiconductor region being held in contact with the first semiconductor region;
forming a trench on the upper face of the first semiconductor region that is shallower than the first semiconductor region, the trench having first and second side faces that contact with the second semiconductor region and the third semiconductor region, respectively, and a third side face intersecting with the first side face and the second side face, the third side face contacts with the first semiconductor region, with the first semiconductor region between the second semiconductor region and the third semiconductor region as viewed in plan;
forming a gate electrode in the trench with a gate insulating film interposed therebetween;
forming a metal layer on an upper face of the third semiconductor region and electrically connected to the third semiconductor region;
forming a source electrode on the semiconductor layer that electrically connects the metal layer and the second semiconductor layer to each other; and
forming a drain electrode that contacts with a rear face of the silicon carbide semiconductor substrate;
the third semiconductor region and the metal layer being joined together by a Schottky junction.

* * * * *